United States Patent
Graff et al.

(10) Patent No.: US 12,075,606 B2
(45) Date of Patent: Aug. 27, 2024

(54) ORIENTATION OF MAGNETIC FILLERS TO OPTIMIZE FILM PROPERTIES

(71) Applicant: 3M INNOVATIVE PROPERTIES COMPANY, St. Paul, MN (US)

(72) Inventors: Michael S. Graff, Woodbury, MN (US); Derek J. Dehn, Maplewood, MN (US); Paul T. Hines, St. Paul, MN (US); Charles L Bruzzone, Woodbury, MN (US); Bharat R. Acharya, Woodbury, MN (US); Ronald D. Jesme, Plymouth, MN (US); William J. Kopecky, Hudson, WI (US); Jennifer J. Sokol, Mahtomedi, MN (US); Sergei A. Manuilov, Bayport, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 390 days.

(21) Appl. No.: 17/607,991

(22) PCT Filed: May 8, 2020

(86) PCT No.: PCT/IB2020/054388
§ 371 (c)(1),
(2) Date: Nov. 1, 2021

(87) PCT Pub. No.: WO2020/229975
PCT Pub. Date: Nov. 19, 2020

(65) Prior Publication Data
US 2022/0354032 A1  Nov. 3, 2022

Related U.S. Application Data

(60) Provisional application No. 62/848,245, filed on May 15, 2019.

(51) Int. Cl.
*H05K 9/00* (2006.01)
*H01F 1/20* (2006.01)
(Continued)

(52) U.S. Cl.
CPC ............ *H05K 9/0075* (2013.01); *H01F 1/20* (2013.01)

(58) Field of Classification Search
CPC ..... H01F 1/20; H01F 1/28; H01F 1/26; H01F 27/361; H01F 38/14; H05K 9/0075
See application file for complete search history.

(56) References Cited

U.S. PATENT DOCUMENTS 4,532,153 A * 7/1985 Sole ..................... H01F 1/20
                                                              427/205
8,329,087 B2   11/2012 Shimizu
(Continued)

FOREIGN PATENT DOCUMENTS

CN        106373693      2/2017
CN        106571221      4/2017
(Continued)

OTHER PUBLICATIONS

International Search report for PCT International Application No. PCT/IB2020/054388 mailed on Aug. 6, 2020, 5 pages.

*Primary Examiner* — Hoa C Nguyen
*Assistant Examiner* — Amol H Patel
(74) *Attorney, Agent, or Firm* — Jonathan L. Tolstedt

(57) ABSTRACT

A magnetic shielding film includes opposing first and second major surfaces and a plurality of particles dispersed therebetween, each particle having a magnetic permeability, a thickness H along a thickness direction of the particle, and a longest dimension L along a length direction of the particle orthogonal to the thickness direction, L/H greater than or equal to 2, the particles defining a plurality of voids ther-
(Continued)

ebetween, the length directions of at least 60% of the particles oriented within 5.5 degrees of a same orientation direction.

19 Claims, 21 Drawing Sheets

(51) Int. Cl.
*H01F 1/26* (2006.01)
*H01F 1/28* (2006.01)
*H01F 27/36* (2006.01)
*H01F 38/14* (2006.01)
*H01F 41/16* (2006.01)

(56) References Cited

U.S. PATENT DOCUMENTS

| | | | |
|---|---|---|---|
| 9,034,157 | B2 | 5/2015 | McLeod |
| 10,287,413 | B2 | 5/2019 | Acharya |
| 2004/0105980 | A1* | 6/2004 | Sudarshan et al. ..... H01F 1/447 428/404 |
| 2014/0267951 | A1 | 9/2014 | Lee |
| 2016/0268033 | A1* | 9/2016 | Kim ........................ H01F 1/14 |
| 2017/0027090 | A1* | 1/2017 | Sumi ........................ H01B 7/18 |
| 2017/0092409 | A1 | 3/2017 | Graham |

FOREIGN PATENT DOCUMENTS

| | | | |
|---|---|---|---|
| CN | 107369550 | | 11/2017 |
| DE | 10343188 | | 12/2004 |
| EP | 0878984 | | 11/1998 |
| EP | 2797092 | | 10/2014 |
| JP | 7022771 | | 1/1995 |
| JP | 2687124 | | 12/1997 |
| JP | 2003229694 | | 8/2003 |
| JP | 3926447 | | 6/2007 |
| JP | 2013253122 | | 12/2013 |
| JP | 2013253122 A | * 12/2013 | ............... H01F 1/26 |
| JP | 2014029936 | | 2/2014 |
| JP | 2017126643 | | 7/2017 |
| WO | WO2003-098989 | | 11/2003 |
| WO | WO2010-016834 | | 2/2010 |
| WO | WO2011-068819 | | 6/2011 |
| WO | WO2018-116127 | | 6/2018 |
| WO | WO2019-097449 | | 5/2019 |

* cited by examiner

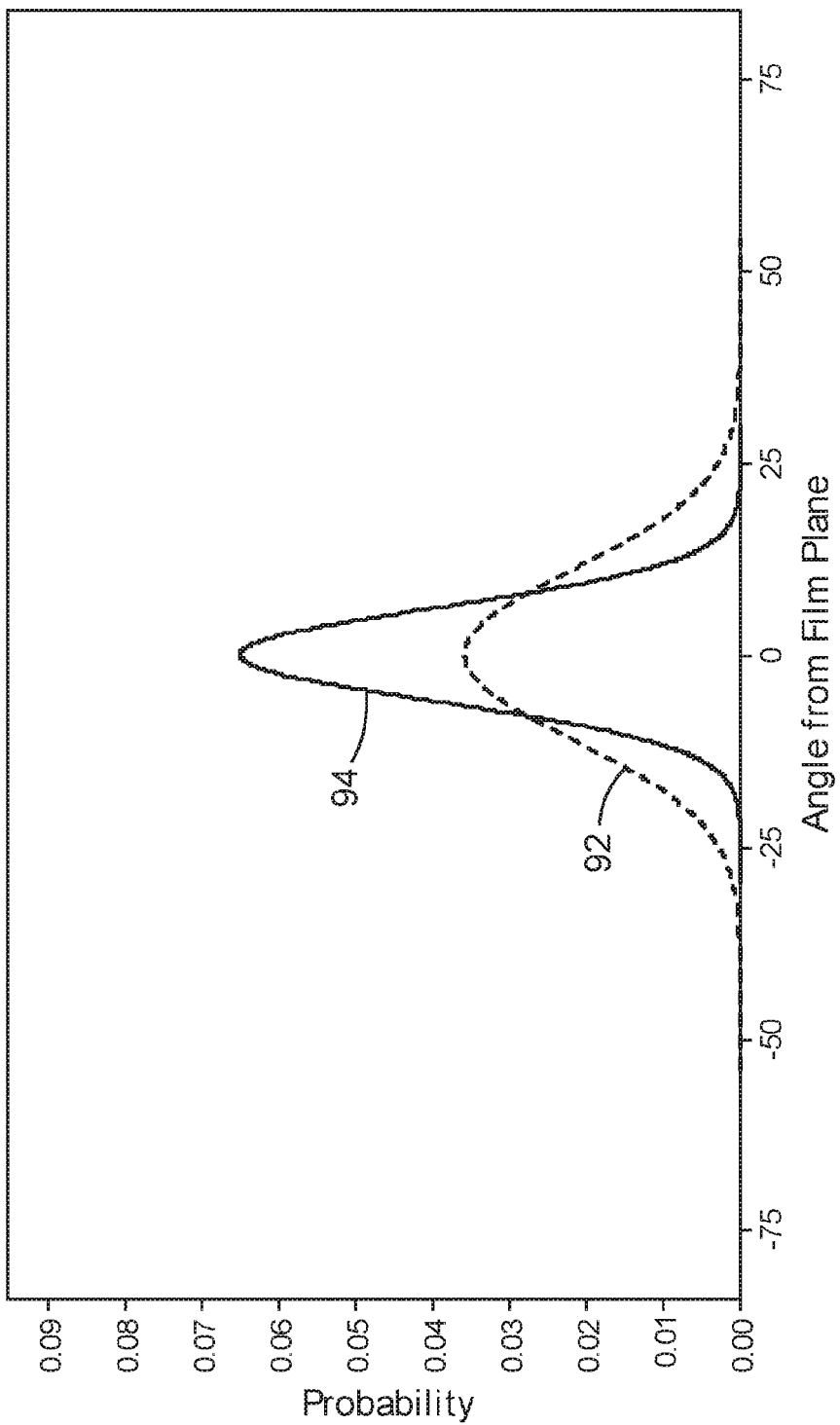

| Example Number | 1 | 2 | 3 | 4 |
|---|---|---|---|---|
| ID Number: | 2197-13 | 2197-5 | 2197-36-1362 | 2197-11 |
| Solids Composition (wt %): | | | | |
| Sendust SP-8S | 96.0 | 96.0 | 94.5 | 95.0 |
| UHMWPE (GUR 2126) | 4.0 | 4.0 | 5.5 | 5.0 |
| (Mineral Oil : Solids) weight ratio | (60:40) | (60:40) | (51.5 : 48.5) | (43:57) |
| Extrusion: | | | | |
| Neck Tube Temp (F) | 400 | 400 | 400 | 400 |
| Die Temp. (F) | 350 | 350 | 350 | 350 |
| Casting Drum Speed (ft/min) | 5 | 5 | 5 | 5 |
| Magnetic Alignment: | Yes | Yes | No | Yes |
| Skid Plate Setting (in) | -0.075 | -0.15 | N.A. | -0.15 |
| Magnet Gap (in) | 1.163 | 1.163 | N.A. | 1.163 |
| Physical Properties: | | | | |
| Thickness: (microns) | 92.8 | 100 | 113 | 174 |
| Density: (gm/cc) | 4.07 | 4.14 | 3.84 | 3.64 |
| Magnetic Properties: | | | | |
| Relative Permeability at 1MHz.: | 225 | 218 | 152 | 134 |
| Coercivity: (Oe) | 1.52 | 1.53 | 1.25 | 1.43 |
| Saturation Induction: (Gauss) | 6,924 | 6,826 | 5,920 | 5,906 |

In all cases, mineral oil was extracted in Novec 72DE, 3 washes, each for 20 mins.
All samples were ultrasonically densified in a fixed load mode, at 650 lbs., 0.55 mils amplitude, at 1 ft/min.

FIG. 13

ORIENTATION OF MAGNETIC FILLERS TO OPTIMIZE FILM PROPERTIES

CROSS REFERENCE TO RELATED APPLICATIONS

This application is a national stage filing under 35 U.S.C. 371 of PCT/IB2020/054388, filed May 8, 2020, which claims the benefit of Provisional Application No. 62/848,245, filed May 15, 2019, the disclosure of which is incorporated by reference in its/their entirety herein.

SUMMARY

In some aspects of the present description, a magnetic shielding film is provided including opposing first and second major surfaces and a plurality of particles dispersed therebetween, each particle having a magnetic permeability, a thickness H along a thickness direction of the particle, and a longest dimension L along a length direction of the particle orthogonal to the thickness direction, L/H greater than or equal to 2, the particles defining a plurality of voids therebetween, the length directions of at least 60% of the particles oriented within 5.5 degrees of a same orientation direction.

In some aspects of the present description, a magnetic shielding film is provided, including a resin having a number average molecular weight greater than about $10^4$ g/mol, and a plurality of anisotropically-shaped particles dispersed therein at a volume loading of greater than about 50%, or 55, or 60, or 65, at a frequency of about 1 MHz, the film having: a magnetic saturation greater than about 6000 gauss, and real parts of relative permeability $\mu'1$ and $\mu'2$ along respective thickness and in-plane directions of the film, $\mu'1 \leq 5$ and $\mu'2 \geq 150$.

In some aspects of the present description, an electronic device is provided, including a plate configured to substantially attenuate an energy contained in electromagnetic waves in a first frequency band, a receiver antenna disposed on the plate for wireless charging a battery disposed in the device in the first frequency band, and a magnetic shielding film disposed between the plate and the receiver antenna. The magnetic shield film may include a plurality of anisotropically-shaped particles dispersed in a resin at a volume loading of greater than about 50%, the particles oriented substantially along a same direction and defining a plurality of voids therebetween, such that when the device is placed adjacent a transmitter antenna transmitting a power Ptx in the first frequency band to the receiver antenna, and the receiver antenna receives a power Prx from the transmitter antenna, after an increase in Prx results in an initial decrease of at least 1% in Prx/Ptx, Prx/Ptx decreases by less than about 5% when Prx is further increased so that Prx increases by at least a factor of two.

In some aspects of the present description, a magnetic shielding film is provided, including a resin and a plurality of anisotropically-shaped particles dispersed in the resin at a volume loading of greater than about 50%, the resin including a plurality of fiber-like generally parallel polymeric elements interconnecting the particles, such that at a frequency of about 1 MHz, a real part of a relative permeability of the magnetic shielding film along an in-plane direction of the magnetic shielding film is greater than the quantity (420.0-0.04M), where M is a magnetic saturation of the magnetic shielding film in gauss.

In some aspects of the present description, a magnetic shielding film is provided including a resin and a plurality of anisotropically-shaped particles dispersed in the resin at a volume loading of greater than about 50%, the resin including a plurality of fiber-like generally parallel polymeric elements interconnecting the particles, such that at a frequency of about 1 MHz, a real part of a relative permeability of the magnetic shielding film along an in-plane direction of the magnetic shielding film is greater than about 130, and a magnetic saturation of the magnetic shielding film is greater than about 6,000 gauss.

In some aspects of the present description, a magnetic shielding film is provided including a polymeric material and a plurality of particles dispersed therein, the particles having magnetic permeability, the polymeric material including a plurality of substantially parallel fiber-like elements generally oriented along a thickness direction of the magnetic shielding film and interconnecting the plurality of particles.

In some aspects of the present description, a method of making a magnetic shielding film is provided, including the steps of: providing a polymer having a number average molecular weight greater than about $10^4$ g/mol, a diluent miscible with the polymer and, a plurality of anisotropically-shaped particles having magnetic permeabilities; mixing the polymer, the diluent and the plurality of anisotropically-shaped particles to form a miscible solution; forming a layer of the miscible solution; applying a magnetic field to the layer to orient the particles along substantially a same orientation direction; inducing a phase separation of the polymer from the diluent while the magnetic field is applied to the layer and the particles are oriented along substantially the orientation direction; and removing at least a portion of the diluent to form a magnetic shielding film, wherein at least 60% of the particles are oriented within 5 degrees of the orientation direction.

BRIEF DESCRIPTION OF THE DRAWINGS

FIGS. 7A-7C provide information comparing a film created by a film formation process using calendering in accordance with an embodiment of the present description compared to a typical prior art film;

FIG. 13 is a table showing the experimental performance of four example magnetic shielding films, in accordance with an embodiment of the present description;

DETAILED DESCRIPTION

Figure 1:
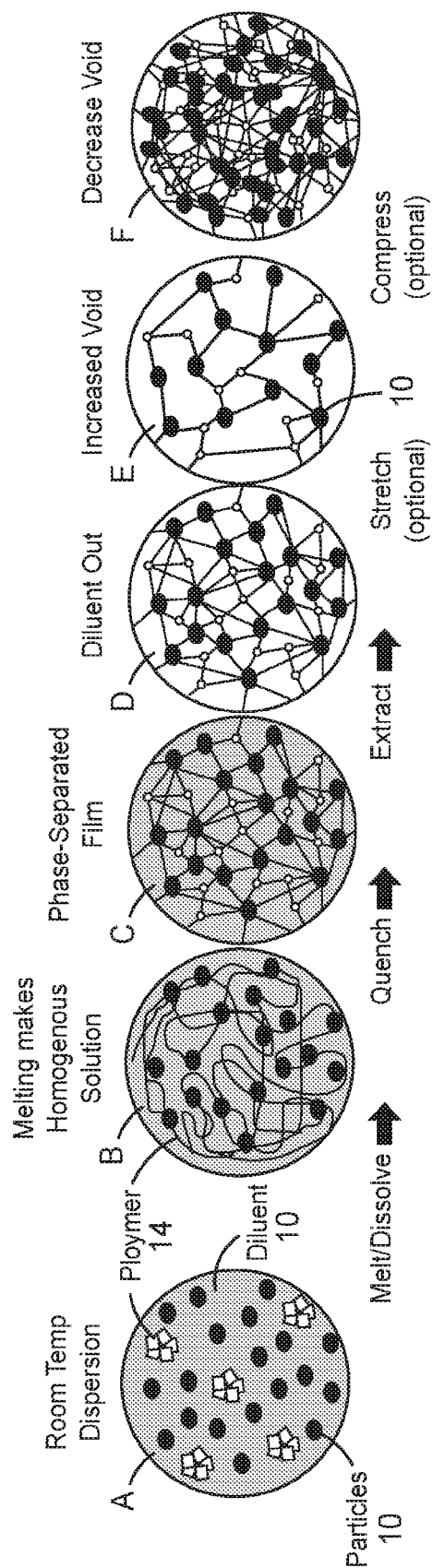
FIG. 1 is a process flow diagram of a film formation and densification process from the prior art.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

A magnetic shielding film may be formed from a highly-loaded composite material having magnetic flake-shaped or rod-shaped filler particles bound together by a suitable resin. For best results, such a composite should have the following characteristics: (1) a high-volume fraction (greater than 60 vol %) of flake-shaped or elongated filler particles to maximize magnetic saturation induction, and (2) a high degree of particle orientation coplanar to the film plane to maximize magnetic permeability and facilitate high packing density with limited damage to the mechanically sensitive filler particles. This translates to more effective shielding and higher power transfer efficiencies. In addition, the composite should ideally have minimal void volume fraction, with sufficient binder volume fraction to provide good mechanical integrity. High saturation induction translates to faster wireless charging rates in the end use application.

Achieving this composite presents several unique challenges that must be overcome. For example, mixtures with a high loading of solids tend to have a high viscosity and can be difficult to process. In addition, orienting a mixture with a high loading of flake particulates is difficult due to steric interaction of the solid particles. Finally, once a desired structure is created, through whatever means, that structure must then be "locked" into place.

The prior art has attempted to address these challenges by performing the film formation and orientation of the flakes in a relatively fluid state in which the flakes have sufficient mobility. For example, this may be accomplished by generating a fluid mixture by dilution with a solvent and/or a low molecular weight reactive resin, forming a film, applying a magnetic field to the film to help orient the magnetic flakes within (to produce an oriented structure), and locking the structure in place by evaporating the solvent and/or curing the resin matrix.

However, these prior art approaches have several deficiencies that must be addressed. For example, solvent evaporation and curing are relatively gradual (slow) processes, during which the ordered system is subject to disordering through normal mechanical handling and vibrations. Also, the continued application of a magnetic field while the film is in a transitory state may help preserve orientation ordering but can also cause undesirable film deformation by physical migration of the semi-liquid material, or separation of the magnetic flakes from the relatively liquified polymer/diluent.

A novel method of making a magnetic shielding film which addresses and overcomes these challenges is presented. The method addresses these challenges by applying an orienting magnetic field to the magnetic shielding film for a relatively short period of time, then rapidly locking the ordered structure into place using a first-order phase transition. In some embodiments, the first-order phase transition is a thermally-induced phase separation (i.e., TIPS) from a single polymer/diluent gel phase to a two-phase system. In the TIPS process, the polymer forms a strong separate phase in a matter of seconds, the separate phase having a microfibril structure that binds the elongated magnetic particles into a network structure within a continuous diluent phase. In some embodiments, the diluent has a low volatility and can be extracted, either immediately in-line or in an off-line step conducted at some time after the film formation, without disturbing the highly ordered flake arrangement. In some embodiments, once the diluent is extracted, the void volume may be removed by a densification step. The methods described herein build on and provide improvements for the film formation and densification process described in U.S. Pat. No. 10,287,413, the entirety of which is herein incorporated by reference. This process is best described as a family of processes which typically involve high filler loadings in combination with a thermally-induced phase separation (TIPS) process.

FIG. 1 provides an overview of the family of processes typical of film formation and densification process as previously described. In process step A, particles 10, diluent (solvent) 12, and a binder polymer 14 are mixed in a dispersion at room temperature. Examples of particles 10 used in a typical film formation process typically include acoustically active particles, soft magnetic particles, thermally conductive particles, thermally insulating particles, intumescent particles, functional particles, dielectric particles, indicator particles, polar solvent soluble particles, polar solvent swellable particles, or endothermic particles. However, for reasons that will be apparent, the new films and methods described herein will use elongate magnetic particles. At process step B, particles 10, binder polymer 14, and diluents 12 are actively mixed at elevated temperature to dissolve the polymer 14 and diluents 12. In some embodiments, the blend may then be shaped to a desired form factor either by hot pressing the mixtures (e.g., at the lab scale) or by extruding through a heated die (e.g., at large or manufacturing scale).

The hot film is then quenched to a lower temperature at which the phase separation occurs at process step C. After inducing phase separation, at least a portion of the solvent is removed from the polymer composite at process step D, thereby forming a polymer composite sheet having a thermoplastic polymer, network structure and particulate material distributed within the thermoplastic polymer, network structure. In some embodiments, the solvent may be removed by evaporation, high vapor pressure solvents being particularly suited to this method of removal.

After the inducing phase separation and removal of at least a portion of the diluent 12, the formed thermoplastic polymer network structure may, in some embodiments, be stretched (process step E) and/or compressed (process step F) in order to densify the polymer composite. This may be achieved by applying at least one of a compressive force and a tensile force to the polymer composite. In some embodiments, the method of making the polymer composite further includes applying at least one of a compressive force and a tensile force, after the removing the solvent step, thereby densifying the polymer composite sheet. The at least one of a compressive force and a tensile force may be applied by techniques known in the art. For example, a compressive force can be achieved by urging the polymer composite, e.g. polymer composite sheet, through the nip of a pair of nip rolls, e.g. calendaring, the rolls having a gap setting less than the thickness of the polymer composite.

According to some aspects of the present description, a magnetic field is applied during the forming of the magnetic shielding film during the phase transition step described above, then the ordered structure thus produced is rapidly locked into place by cooling the film, creating a magnetic shielding film. In some embodiments, the magnetic shielding film includes opposing first and second major surfaces and a plurality of particles dispersed therebetween, each particle having a magnetic permeability (i.e., the ability of a magnetic material to support the development of a magnetic field). In some embodiments, each particle may have a thickness H along a thickness direction of the particle, and a longest dimension L along a length direction of the particle orthogonal to the thickness direction, such that the ratio L/H is greater than or equal to 2. In some embodiments, the length directions of at least 60% of the particles within the magnetic shielding film are oriented within 5.5 degrees, or within 5 degrees, or within 4.5 degrees, or within 4 degrees of the same orientation direction (i.e., substantially aligned within the same direction).

In some embodiments, the orientation direction may be substantially parallel to the first and second major surfaces. In some embodiments, the particles define a plurality of voids therebetween. In some embodiments, at least some of the voids in the plurality of voids may be interconnected.

In some embodiments, the magnetic shielding film may further include a resin disposed between the first and second major surfaces, where the plurality of particles is dispersed in the resin. In some embodiments, the resin may have a number average molecular weight greater than about $10^4$ g/mol. In some embodiments, the number average molecular weight of the resin may be less than about $10^7$ g/mol.

In some embodiments of the magnetic shielding film, in a cross-section of the magnetic shielding film taken in a vertical direction which is substantially orthogonal to at least one of the first and second major surfaces, the magnetic shielding film may include a plurality of pairs of vertically adjacent particles, wherein a plurality of substantially parallel elongate polymeric elements connects the particles in each of the pairs of vertically adjacent particles. In some embodiments, the substantially parallel elongate polymeric elements may be thermoplastic fibrils, which may adhere directly to and act as a binder for the adjacent particles. In some embodiments, the substantially parallel elongate polymeric elements that connect the adjacent particles are substantially oriented along the vertical direction (i.e., substantially orthogonal to the direction of orientation of the particles, or substantially orthogonal to the first and second major surfaces). In some embodiments, the elongate polymeric elements may include polyethylene.

In some embodiments, the magnetic shielding film may have real parts of relative permeability $\mu'1$ and $\mu'2$ along respective thickness and in-plane directions of the film, such that the ratio $\mu'2/\mu'1$ is greater than or equal to about 100 at a frequency of about 1 MHz. In some embodiments, $\mu'1$ of the magnetic shielding film may be less than or equal to about 5 at about 1 MHz.

In some embodiments, the particles may be dispersed between the first and second major surfaces of the magnetic shielding film at a volume loading of greater than about 50 percent. In some embodiments, the particles may include flakes (i.e., have a thickness substantially smaller than a length and a width of the particle, such as in a thin, flattened bit of material). In some embodiments, the particles may have an average thickness in a range from about 0.5 microns to about 5 microns, and an average longest dimension in a range from about 20 microns to about 200 microns. In some embodiments, the particles may be substantially rod-shaped. In some embodiments, the particles may be substantially disc-shaped. In some embodiments, the particles may be spheroid-shaped. In some embodiments, the particles may have a less thermally conductive inner portion and a more thermally conductive outer portion. In some embodiments, the particles may have thermally conductive coatings on their outermost surfaces.

In some embodiments, the particles may be a ferromagnetic material. In some embodiments, the particles may include, but not be limited to, one or more of the following materials: iron, silicon, aluminum, chromium, nickel, copper, cobalt, and molybdenum. In some embodiments, the particles may include a magnetic coating, and the uncoated particles may or may not themselves have magnetic permeability. In some embodiments, the particles may be thermally conductive. In some embodiments, the magnetic shielding film may have an average thermal conductivity of at least 0.15, or at least 0.2, or at least 0.25 W/(m·K) along a thickness direction of the magnetic shielding film. In some embodiments, the magnetic shielding film may have an average thermal conductivity of at least 5, or at least 7, or at least 9, or at least 10, or at least 10.6 W/(m·K) along an in-plane direction of the magnetic shielding film.

According to some aspects of the present description, a magnetic shielding film may include a resin, the resin having a number average molecular weight greater than about $10^4$ g/mol, and a plurality of anisotropically-shaped particles (e.g., elongated, such that a first dimension of the particle is significantly larger than a second dimension) dispersed therein at a high volume loading (e.g., greater than about 50%, or 55, or 60, or 65), at a frequency of about 1 MHz. In some embodiments, the magnetic shielding film may have a magnetic saturation (i.e., a state when an increase in an applied external magnetic field no longer causes an increase in the magnetization of the film) greater than about 6000 gauss, and real parts of relative permeability $\mu'1$ and $\mu'2$ along respective thickness and in-plane directions of the film, such that $\mu'1$ is less than or equal to about 5 and $\mu'2$ is greater than or equal to about 150. In some embodiments, the resin may include a plurality of fiber-like generally parallel polymeric elements (e.g., thermoplastic fibrils) interconnecting the particles.

In some embodiments of the magnetic shielding film, at least some of the anisotropically-shaped particles are configured to develop magnetic moments (i.e., defining a magnetic strength and orientation of the particles, or a measure of the particle's tendency to align with a magnetic field) in response to a magnetic field. In some embodiments, at least some of the anisotropically-shaped particles may include permanent magnetic moments. In some embodiments, at least some of the anisotropically-shaped particles are magnetically conductive and electrically insulative.

In some embodiments, the resin may be a thermoplastic polymer, which will be formed into a thermoplastic polymer, network structure. The thermoplastic polymer is not particularly limited. In some embodiments, the thermoplastic polymer includes, but is not limited to, at least one of polyurethane, polyester (e.g. polyethylene terephthalate, polybutylene terephthalate and polylactic acid), polyamide (e.g. nylon 6, nylon 6,6 and polypeptides), polyether (polyethylene oxide and polypropylene oxide), polycarbonate (bisphenol-A polycarbonate), polyimide, polysulfone, polyphenylene oxide, polyacrylate (e.g., thermoplastic polymers formed from the addition polymerization of monomer containing an acrylate functional group), polymethacrylate (e.g. thermoplastic polymers formed from the addition polymerization of monomer containing a methacrylate functional group), polyolefin (polyethylene and polypropylene), styrene and styrene based random and block copolymer, chlorinated polymer (polyvinyl chloride), fluorinated polymer (polyvinylidene fluoride; 5 copolymers of tetrafluoroethylene, hexafluoropropylene and vinylidene fluoride; copolymers of ethylene, tetrafluoroethylene; and hexafluoropropylene; and polytetrafluoroethylene), and copolymers of ethylene and chlorotrifluoroethylene. In some embodiments, the thermoplastic polymer may be at least one of a homopolymer and a copolymer, (e.g., a block copolymer or a random copolymer). In some embodiments, the thermoplastic polymer is a mixture of two or more thermoplastic polymer types (e.g., a mixture of polyethylene and polypropylene or a mixture of polyethylene and poly acrylate). In some embodiments, the polymer may be at least one of polyethylene (e.g., ultra-high molecular weight polyethylene), polypropylene (e.g., ultra-high molecular weight polypropylene), polylactic acid, poly(ethylene-co-chlorotrifluoroethylene) and polyvinylidene fluoride. In some embodiments, the thermoplastic polymer is a single thermoplastic polymer (i.e., it is not a mixture of two or more thermoplastic polymer types.)

The molecular weight of the thermoplastic polymer is not particularly limited, except that it must have a molecular weight high enough to allow for phase separation from a solvent, resulting in the formation of the network structure. Generally, this may require that the number average molecular weight of the thermoplastic polymer be greater than about $10^4$ g/mol. Thermoplastic polymers having ultra-high molecular weights may be particularly useful. In some embodiments, ultrahigh molecular weight is defined as a thermoplastic polymer having a number average molecular weight of at least 3×106 g/mol. The number average molecular weight may be measured by know techniques in the art, including, but not limited to, gel permeation chromatography (GPC). GPC may be conducted in a good solvent for the thermoplastic polymer, along with the use of narrow molecular weight distribution polymer standards (e.g., narrow molecular weight distribution polystyrene standards Thermoplastic polymers are generally characterized as being partially crystalline, exhibiting a melting point. In some embodiments, the thermoplastic polymer may have a melting point between 120° C. to 350° C., between 120° C. to 300° C., between 120° C. to 250° C. or even between 120° C. to 200° C. The melting point of the thermoplastic polymer may be measured by known techniques in the art, including but not limited to, the on-set temperature measured in a differential scanning calorimetry (DSC) test, conducted with a 5 mg to 10 mg sample, at a heating scan rate of 10° C./min, while the sample is under a nitrogen atmosphere.

In some embodiments, the thermoplastic polymer may be formed into a thermoplastic polymer network structure through a process which includes mixing the thermoplastic polymer and an appropriate solvent to form a miscible thermoplastic polymer-solvent solution, followed by phase separation of the thermoplastic polymer from the solvent, and then removing at least a portion of the solvent. This process is typically conducted with the addition of a particulate material to the miscible polymer-solvent solution, prior to phase separation. In some embodiments, the particulate material may be ferromagnetic particles. The thermoplastic polymer network structure may be formed during the phase separation step of the process. In some embodiments, the thermoplastic polymer network structure is produced by an induced phase separation of a miscible thermoplastic polymer-solvent solution. The thermoplastic polymer network structure inherently includes porosity (i.e., pores). The porosity may be continuous, enabling fluid communication from an interior region of the thermoplastic polymer network structure to a surface of the thermoplastic polymer, network structure and/or between a first surface of the thermoplastic polymer network structure and an opposing second surface of the thermoplastic polymer network structure.

The pore size of the thermoplastic polymer network structure is not particularly limited. In some embodiments, the pore size is on the micrometer scale (i.e., between about 1 micrometer and 1000 micrometers). In some embodiments, the pore size is on the nanometer scale (i.e., between about 10 nanometers and 1000 nanometers). In some embodiments the average or median pore size, P, of the thermoplastic polymer, network structure is between 10 nanometers to 1000 micrometers, between 10 nanometers to 500 micrometers, between 10 nanometers to 250 micrometers, between 10 nanometers to 100 micrometers, between 10 nanometers to 50 micrometers, between 10 nanometers to 25 micrometers, between 100 nanometers to 1000 micrometers, between 50 nanometers to 1000 micrometers, between 50 nanometers to 500 micrometers, between 50 nanometers to 250 micrometers, between 50 nanometers to 100 micrometers, between 50 nanometers to 50 micrometers, between 50 nanometers to 25 micrometers, between 100 nanometers to 1000 micrometers, between 100 nanometers to 500 micrometers, between 100 nanometers to 250 micrometers, between 100 nanometers to 100 micrometers, between 100 nanometers to 50 micrometers, between 100 nanometers to 25 micrometers, between 250 nanometers to 1000 micrometers, between 250 nanometers to 500 micrometers, between 250 nanometers to 250 micrometers, between 250 nanometers to 100 micrometers, between 250 nanometers to 50 micrometers or even 5 between 250 nanometers to 25 micrometers. Conventional pore size analysis techniques, including imaging of cross-sections (e.g., optical microscopy, scanning electron microscopy or atomic force microscopy) and analysis of the image using appropriate software may be used to statistically analyze the pore size and pore size distribution. X-ray microtomography and mercury porosimetry, bubble point and capillary flow porosimetry may also be used to analyze the pore size and/or pore size distribution. The continuous nature of the porosity of the thermoplastic polymer, network structure may facilitate removal of the solvent from the thermoplastic polymer network structure. In the present disclosure, the term "thermoplastic polymer network structure" inherently means that at least a portion of the porosity of the thermoplastic polymer, network structure is free of liquid and solid (e.g., contains one or more gases, such as air). In some embodiments, between 10 percent to 100 percent, between 30 percent to 100 percent, between 50 percent to 100 percent, between 60 percent to 100 percent, between 70 percent to 100 percent, between 80 percent to 100 percent, between 90 percent to 100 percent, between 95 percent to 100 percent, or even 20 between 98 percent to 100 percent by volume, of the porosity of the thermoplastic polymer, network structure is free of liquid and solid, (e.g., contains one or more gases, such as air).

In order to form a miscible thermoplastic polymer-solvent solution, the solvent is required to dissolve the thermoplastic polymer. Thus, the solvent for a specific thermoplastic polymer is selected based on this requirement. The thermoplastic polymer-solvent mixture may be heated to facilitate the dissolution of the thermoplastic polymer in the solvent. After the thermoplastic polymer has phase separated from the solvent, at least a portion of the solvent is removed from the thermoplastic polymer, network structure using techniques known in the art, including evaporation of the solvent or extraction of the solvent by a lower vapor pressure, second solvent, followed by evaporation of the second solvent. In some embodiments, at least 10 percent to 100 percent, at least 30 percent to 100 percent, at least 50 percent to 100 percent, at least 60 percent to 100 percent, at least 70 percent to 100 percent, at least 80 percent to 100 percent, at least 90 percent to 100 percent, at least 95 percent to 100 percent or even at least 98 percent to 100 percent by weight of the solvent, and second solvent, if used, is removed from the thermoplastic polymer, network structure.

According to some aspects of the present description, an electronic device (e.g., a wireless charging system) may include a plate configured to substantially attenuate an energy contained in electromagnetic waves in a first frequency band, a receiver antenna disposed on the plate for wireless charging of a battery disposed in the device in the first frequency band, and a magnetic shielding film disposed between the plate and the receiver antenna. In some embodiments, the plate may attenuate the energy contained in the electromagnetic waves by absorbing the energy. In some embodiments, the magnetic shield film may include a plurality of anisotropically-shaped particles (e.g., flake-shaped or rod-shaped particles, or particles which are longer in a first direction than in a second direction orthogonal to the first direction) dispersed in a resin at a volume loading of greater than about 50%. In some embodiments, the particles may be oriented substantially along the same direction, and may define a plurality of voids therebetween. In some embodiments, at least some of the voids may be interconnected.

In some embodiments, when the device is placed adjacent a transmitter antenna transmitting a power Ptx in the first frequency band to the receiver antenna, and the receiver antenna receives a power Prx from the transmitter antenna, and after an increase in Prx results in an initial decrease of at least 1% in Prx/Ptx, Prx/Ptx may decrease by less than about 5% when Prx is further increased so that Prx increases by at least a factor of two. In some embodiments, for the increase in Prx that results in the initial decrease of at least 1% in Prx/Ptx, Prx increases from an initial value of at least 5 watts. For the purposes of this specification, the phrase "first frequency band" is intended to represent any appropriate band of frequencies by with power may be transmitted wirelessly, and is not meant to be limiting.

According to some aspects of the present description, a magnetic shielding film is provided, including a resin and a plurality of anisotropically-shaped particles dispersed in the resin at a volume loading of greater than about 50%. In some embodiments, the resin may include a plurality of fiber-like, generally parallel polymeric elements interconnecting the particles, such that, at a frequency of about 1 MHz, a real part of a relative permeability of the magnetic shielding film along an in-plane direction of the magnetic shielding film is greater than the quantity (420.0-0.04M), where M is a magnetic saturation of the magnetic shielding film in gauss. In some embodiments, the particles have a magnetic permeability greater than about 10, greater than about 50, or greater than about 100. In some embodiments, the fiber-like, generally parallel polymeric elements may be thermoplastic fibrils, which may adhere directly to and act as a binder for the dispersed particles.

According to some aspects of the present description, a magnetic shielding film is provided, including a resin and a plurality of anisotropically-shaped particles dispersed in the resin at a volume loading of greater than about 50%. In some embodiments, the resin may include a plurality of fiber-like generally parallel polymeric elements interconnecting the particles, such that at a frequency of about 1 MHz, a real part of a relative permeability of the magnetic shielding film along an in-plane direction of the magnetic shielding film is greater than about 130, and a magnetic saturation of the magnetic shielding film is greater than about 6,000 gauss.

According to some aspects of the present description, a magnetic shielding film is provided including a polymeric material and a plurality of particles dispersed therein, the particles having magnetic permeability. In some embodiments, the polymeric material may include a plurality of substantially parallel fiber-like elements (e.g., fibrils) generally oriented along a thickness direction of the magnetic shielding film and interconnecting the plurality of particles.

According to some aspects of the present description, a method of making a magnetic shielding film is provided, including the steps of: providing a polymer having a number average molecular weight greater than about $10^4$ g/mol, or greater than $10^5$ g/mol, or greater than $10^6$ g/mol, a diluent miscible with the polymer and, a plurality of anisotropically-shaped particles having magnetic permeabilities; mixing the polymer, the diluent and the plurality of anisotropically-shaped particles to form a miscible solution; forming a layer of the miscible solution; applying a magnetic field to the layer to orient the particles along substantially a same orientation direction; inducing a phase separation of the polymer from the diluent while the magnetic field is applied to the layer and the particles are oriented along substantially the orientation direction; and removing at least a portion of the diluent to form a magnetic shielding film, wherein at least 60% of the particles are oriented within 5 degrees of the orientation direction.

In some embodiments, the step of removing at least a portion of the diluent results in an intermediate magnetic shielding film, and the method further includes a step of increasing a volume loading of the particles in the intermediate magnetic shielding film to form the magnetic shielding film. In some embodiments, the volume loading is increased by applying a vibratory energy and a compressive force to the polymer. In some embodiments, the vibratory energy is an ultrasonic energy. In some embodiments, at least 50% of the particles in the intermediate magnetic shielding film are oriented within 5 to 20 degrees of the orientation direction. In some of the embodiments, at least 60% of the particles in the intermediate magnetic shielding film are oriented within 5 to 20 degrees of the orientation direction. In some embodiments, at least 50% of the particles in the intermediate magnetic shielding film are oriented within 5 to 15 degrees of the orientation direction.

Figure 2A:
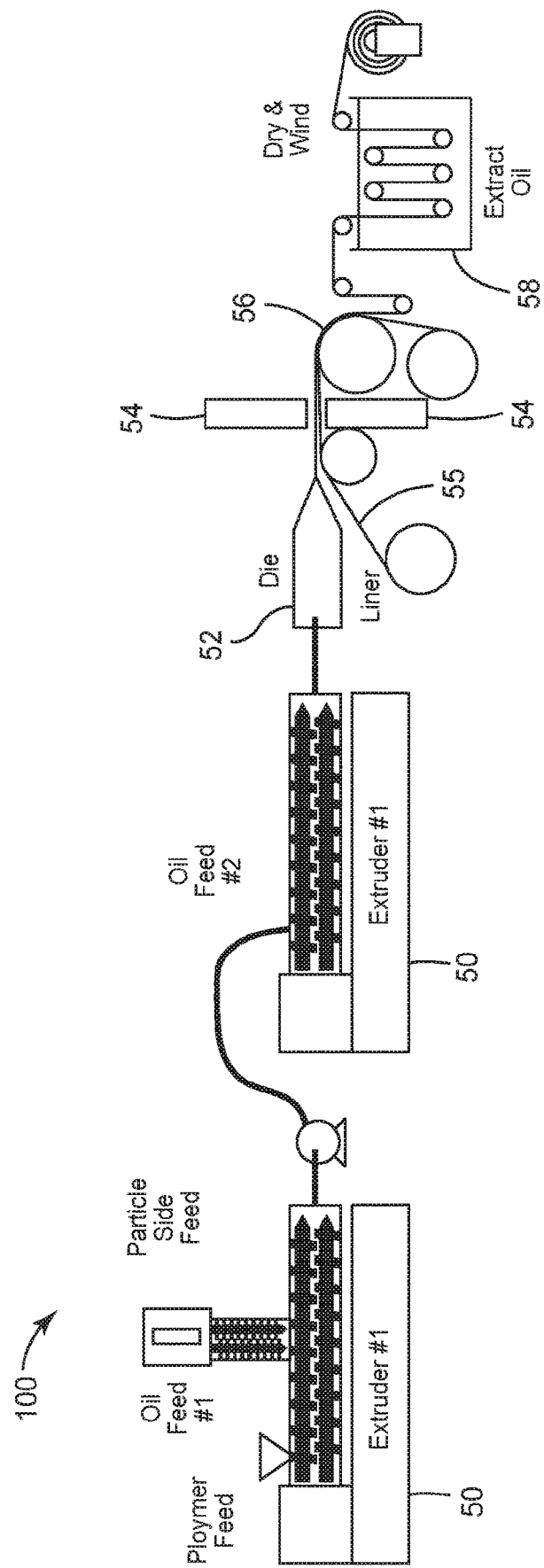
FIG. 2A describes key processing elements for a film formation and densification process, in accordance with an embodiment of the present description.

Returning to the drawings, FIG. 2A describes key processing elements for a film formation and densification process using magnetic alignment, which builds upon the film formation processes outlined in FIG. 1. In some embodiments, one or more material extruders 50 are used to mix raw materials. In some embodiments, the raw materials may include a polymer having a average molecular weight of at least about $10^4$ g/mol, a diluent (e.g., solvent) miscible with the polymer and, a plurality of anisotropically-shaped particles having magnetic permeabilities. "Miscible" as used herein refers to the ability of substances to mix in all proportions (i.e., to fully dissolve in each other at any concentration) forming a solution. For some solvent-polymer systems, heat may be needed for the polymer to be miscible with the solvent. By contrast, substances are immiscible if a significant proportion does not form a solution. For example, butanone is significantly soluble in water, but these two solvents are not miscible because they are not soluble in all proportions. In some cases, a component is a solvent for a polymer at a higher temperature, but not at a lower temperature. At the higher temperature, the polymer and the component form a miscible polymer-solvent solution. When the temperature is lowered, the component is no longer a solvent for polymer and the polymer may then phase separate from the component to form a polymeric network. When a phase transformation is induced by a change in temperature, the phase separation can be referred to as a thermally induced phase separation (TIPS) process.

In some embodiments, two extruders 50 may be used. For example, the raw materials may be mixed in a first extruder 50, and then further mixing occurs in a second extruder to attain the final diluent concentration. In some embodiments, a single, larger extruder 50 which allows for enough mixing may be used instead of two extruders 50. In some embodiments, any appropriate number of extruders may be used.

In some embodiments, after a miscible solution is formed at extruders 50, the solution passes into an extrusion die 52, where it is pushed through a slit into a flattened form, before it passes over a casting drum 56 where it is quenched and cast into a film. In some embodiments, before passing over the casting drum 56, the flattened solution passes between a magnetic field generated by magnetic components 54, where the anisotropically-shaped particles contained within the forming film are oriented (i.e., aligned) along substantially a same orientation direction. That is, the particles are pulled by the magnetic field such that they align in the same direction. In some embodiments, that same direction may be substantially parallel to the film (i.e., aligns with the direction of travel of the film as it passes through the system). In some embodiments, the same direction may be substantially orthogonal to the film. In some embodiments, the direction of alignment (i.e., the same direction) may be any appropriate direction. In some embodiments, the solution may be fed onto a carrier film (e.g., a liner of polyethylene terephthalate, or PET) 55 which carries the solution through the following process steps.

While the magnetic field is still applied, a phase separation is induced as the film passes over the casting drum 56, separating the polymer from the diluent and locking the aligned particles in place. In some embodiments, after the film has solidified, the diluent may be extracted in an in-line oil extraction process 58. In some embodiments, the diluent may be extracted in a separate, off-line system. In some embodiments, after the diluent is extracted from the film, the film may be densified (not shown). In some embodiments, the densification is done using a vibrational energy (e.g., ultrasonic energy). Densification of the film may increase the magnetic saturation induction property of the film.

Figure 2B:
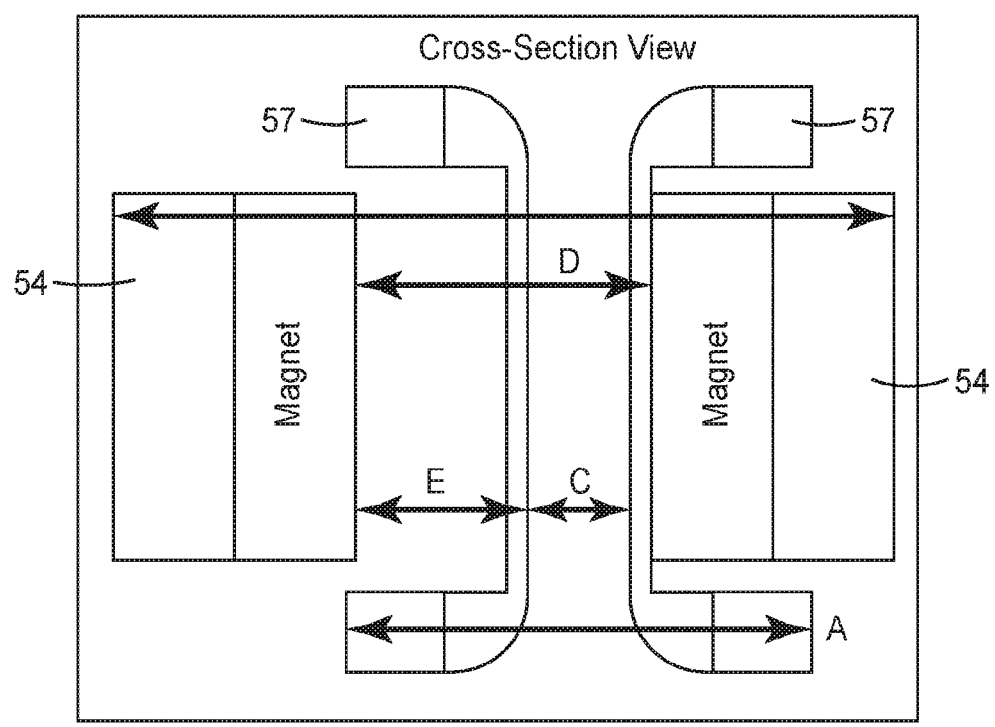
FIG. 2B is a close-up view of a magnet assembly used in a film formation process in accordance with an embodiment of the present description.

FIG. 2B is a close-up view of the magnet assembly used in a film formation embodiment shown in FIG. 2A. It should be noted that the magnet assembly is depicted in FIG. 2B at an orientation which differs from its orientation in FIG. 2A. Magnetic components 54 are mounted with U-shaped skid plates 57. The position of skid plates 57 and magnetic components 54 (distances labeled, A, B, C, D, and E) are calculated so as to produce the desired magnetic field strength, orientation, and position to properly align the particles within the film. The film will lie on the lower skid plate 57 (shown on the left side in FIG. 2B), so the position of this skid plate 57 is determined such that a film passing over its surface will be at the optimal location within the created magnetic field (e.g., approximately equidistant from the top and bottom magnetic components 54).

In some embodiments, magnetic components 54 may be permanent magnets. In some embodiments, magnetic components 54 may be electromagnets. In some embodiments, a north-facing-north magnetic pole structure (i.e., the north pole of the top magnet faces the north pole of the bottom magnet, as depicted in FIG. 2A) may be used to generate a substantially planar magnetic field at the position of the bottom skid plate 57. In other embodiments, a south-facing-south pole structure may be used.

Figure 3A:
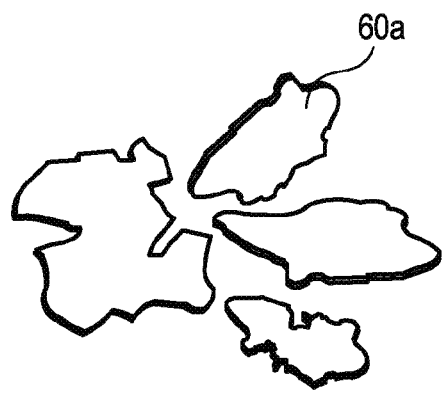
FIGS. 3A-3D provide examples of particle shapes for use in a film formation and densification process, in accordance with an embodiment of the present description.
Figure 3B:
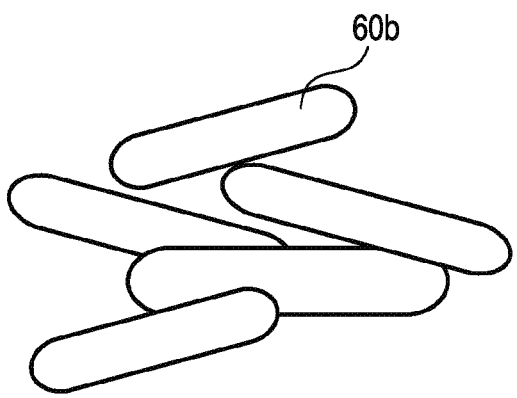
Figure 3C:
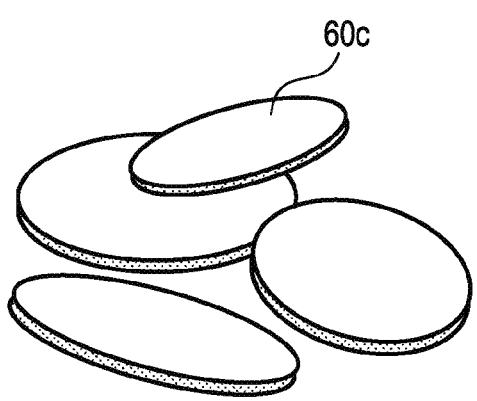
Figure 3D:
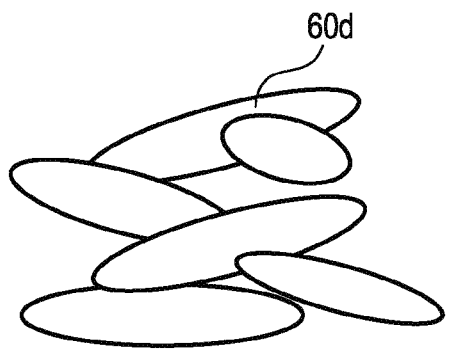

The particles used in film formation process embodiments of the present description may be anisotropically-shaped. That is, they are longer in at least one dimension then they are in at least one other dimension. This allows the particles which exhibit magnetic moments to be aligned in the presence of a magnetic field (i.e., allows the longest dimension of the particles to be substantially aligned with an applied planar magnetic field.) FIGS. 3A-3D provide some examples of particle shapes which may be used in a film formation and densification process embodiments of the present description. These examples are for illustration purposes and are not meant to be limiting. FIG. 3A shows particles which exhibit a flattened, flake shape. In some embodiments, flake-shaped particles may align in a planar magnetic field such that the planar surfaces of the flakes are parallel to the magnetic field. FIG. 3B shows particles which exhibit a cylindrical or rod shape. FIG. 3C shows particles which are disc-shaped, and FIG. 3D shows particles which are spheroid-shaped. The images shown in the subsequent figures herein use flake-shaped particles, similar to those shown in FIG. 3A. However, any appropriate anisotropically-shaped particle may be used with similar effect.

Figure 4:
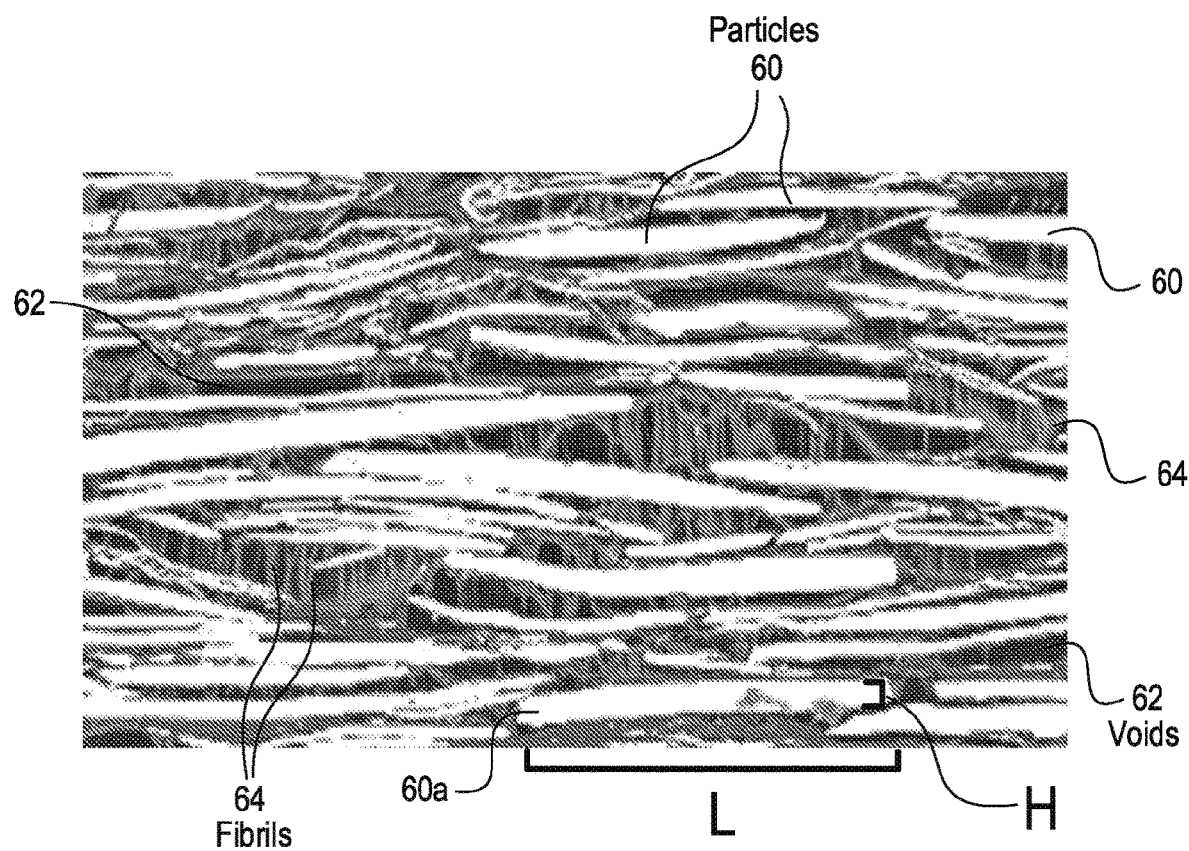
FIG. 4 illustrates a magnetic shielding film, in accordance with an embodiment of the present description.

FIG. 4 provides a cross-sectional image of a magnetic shielding film as created from an embodiment of the film formation method of the present description. In some embodiments, the magnetic shielding film may include a number of anisotropically-shaped particles 60 (e.g., flakes) exhibiting magnetic permeability (i.e., can support a magnetic field), and separated by a number of voids 62. In some embodiments, pairs of vertically adjacent particles 60 may be connected to each other by substantially parallel elongate polymeric elements (i.e., fibrils of polymer) 64. In some embodiments, the elongate polymeric elements 64 may be oriented substantially vertically (i.e., substantially orthogonal to the orientation direction of particles 60.) Each particle 60 (such as example particle 60*a* of FIG. 4) has a thickness H along a thickness direction of the particle, and a longest dimension L along a length direction of the particle orthogonal to the thickness direction. In some embodiments, the ratio of L/H may be greater than or equal to about 2, or about 4, or about 6. In some embodiments, the length directions of at least 60% or at least 70% or at least 80% of the particles may be oriented within 5.5 degrees of a same orientation direction (e.g., aligned substantially parallel to a length direction of the magnetic shielding film.)

FIGS. 5A-8C provide information comparing films created by various embodiments of the magnetic film formation process described herein with commercially available films in the prior art. In each of the images of films in FIGS. 5A-8C, light-colored lines represent particles (e.g., magnetic dust/flakes) and or connecting polymeric elements, and darker regions represent the voids between particles (which may include a binder such as a polymeric resin).

Figure 5A:
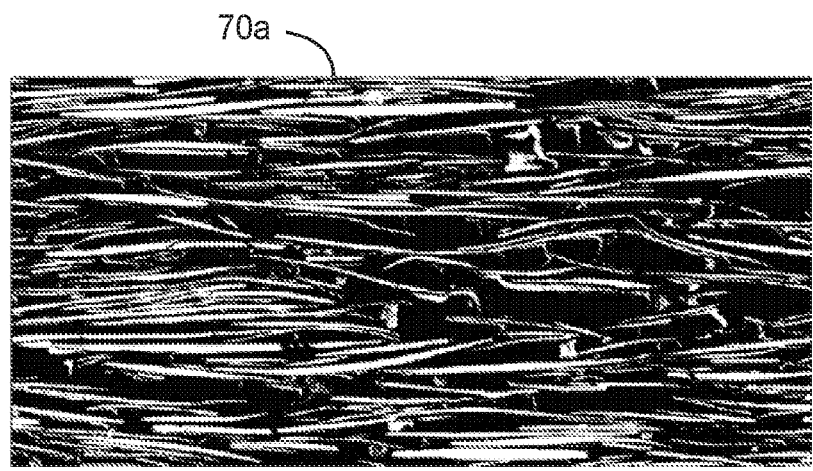
FIGS. 5A-5C provide information comparing a film created by a film formation process using magnetic alignment and ultrasonic densification in accordance with an embodiment of the present description compared to a typical prior art film.
Figure 5B:
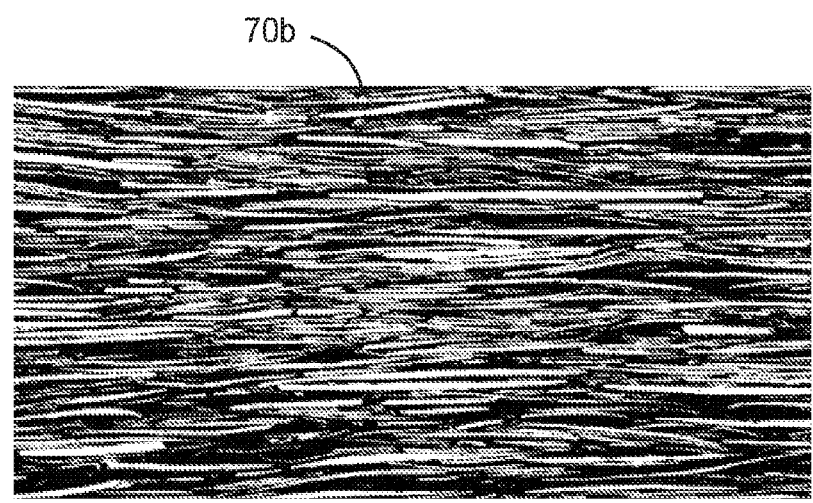
Figure 5C:
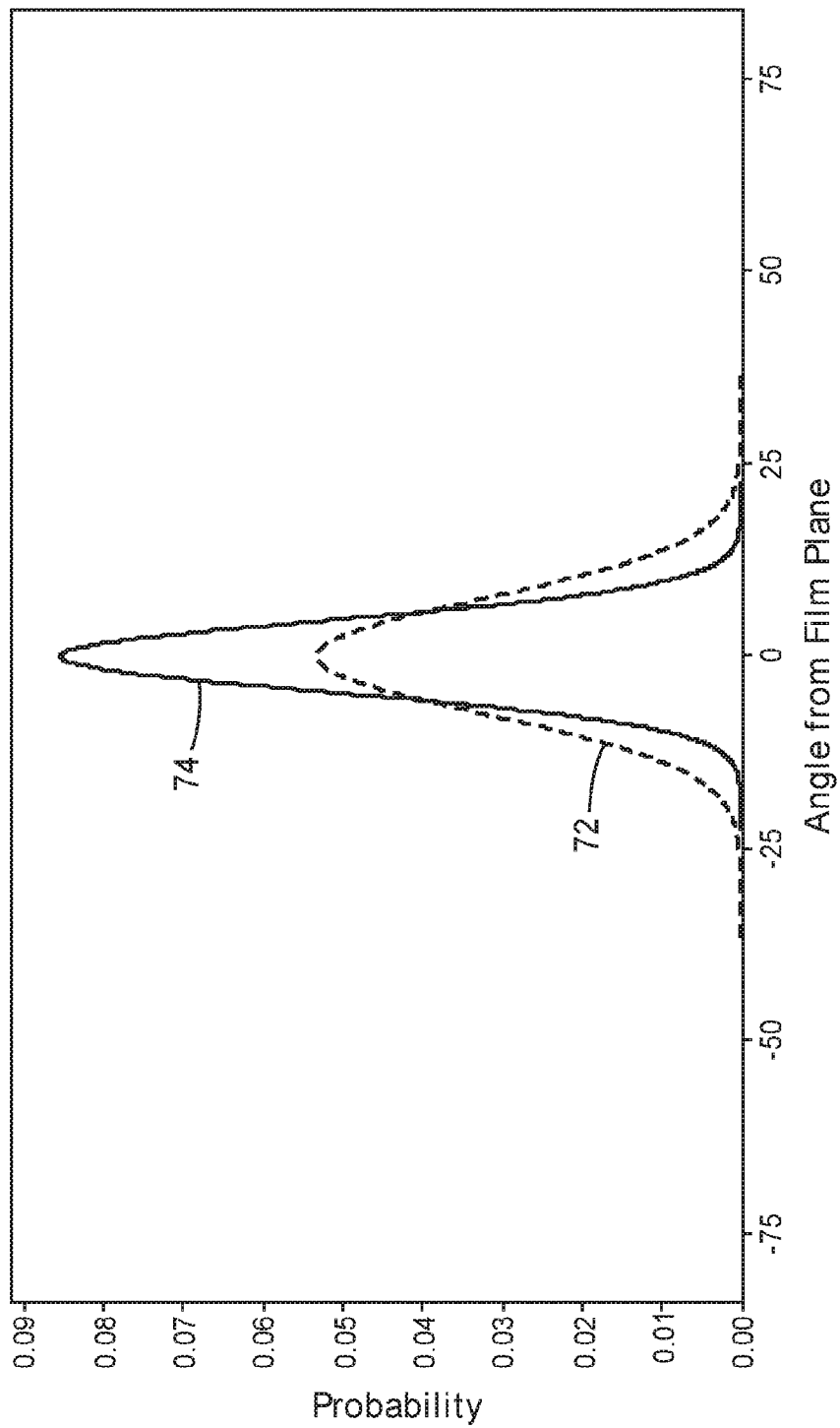

FIGS. 5A-5C compare films created using an embodiment of the magnetic film formation process of the present description using magnetic alignment and ultrasonic densification to a commercially available magnetic film of the prior art. FIG. 5A shows an image of the prior art film 70*a*, and FIG. 5B shows an image of a film 70*b* created using a process in accordance with an embodiment of the present description. Specifically, FIG. 5B shows a film created using a magnetic alignment process in combination with ultrasonic densification. It can be seen that the prior art film 70*a* of FIG. 5A has a much smaller degree of alignment (more light lines at angles not aligned with the film) and larger voids (more dark area between adjacent particles) than the film 70*b* of FIG. 5B created using an embodiment of a process of the present description. FIG. 5C presents a comparison of orientation distribution functions for magnetically aligned and ultrasonically densified film 74 versus prior art film 72. It can be seen from this example graph that films 74 made by the processes described herein have a much tighter, higher distribution graph (i.e., a higher percentage of particles more closely aligned) than the prior art films 72.

Figure 6A:
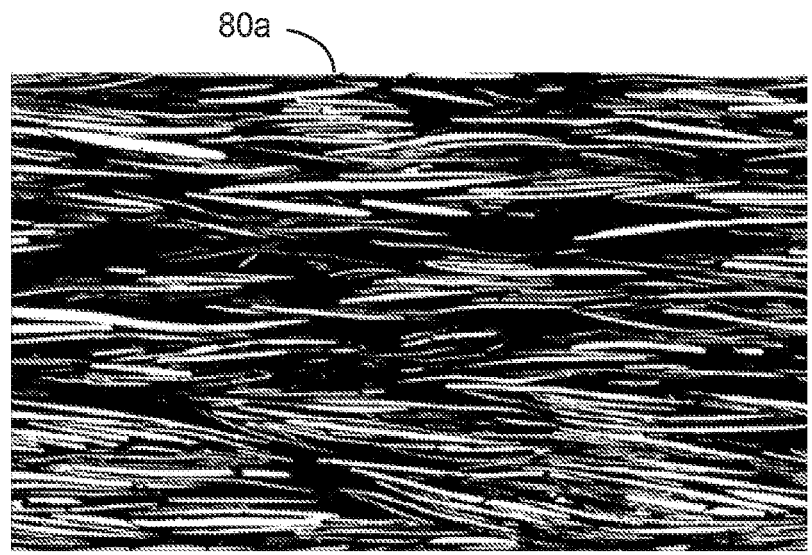
FIGS. 6A-6C provide information comparing a film created by a film formation process using ultrasonic densification in accordance with an embodiment of the present description compared to a typical prior art film.
Figure 6B:
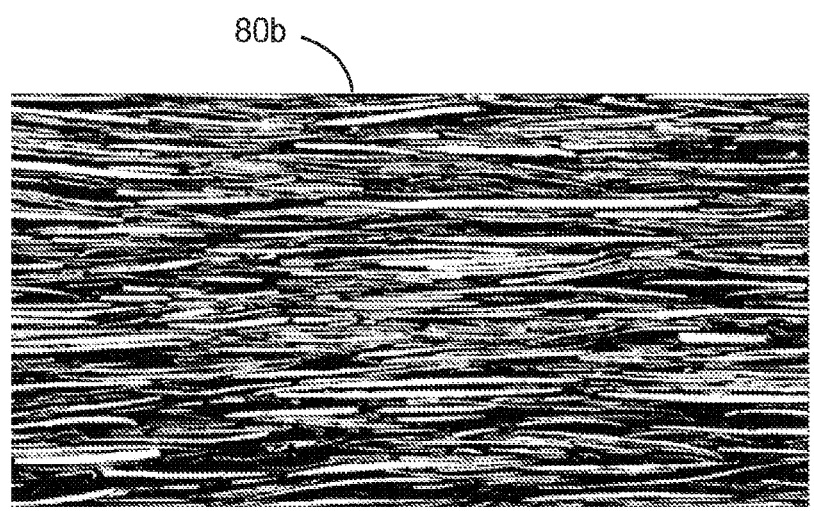
Figure 6C:
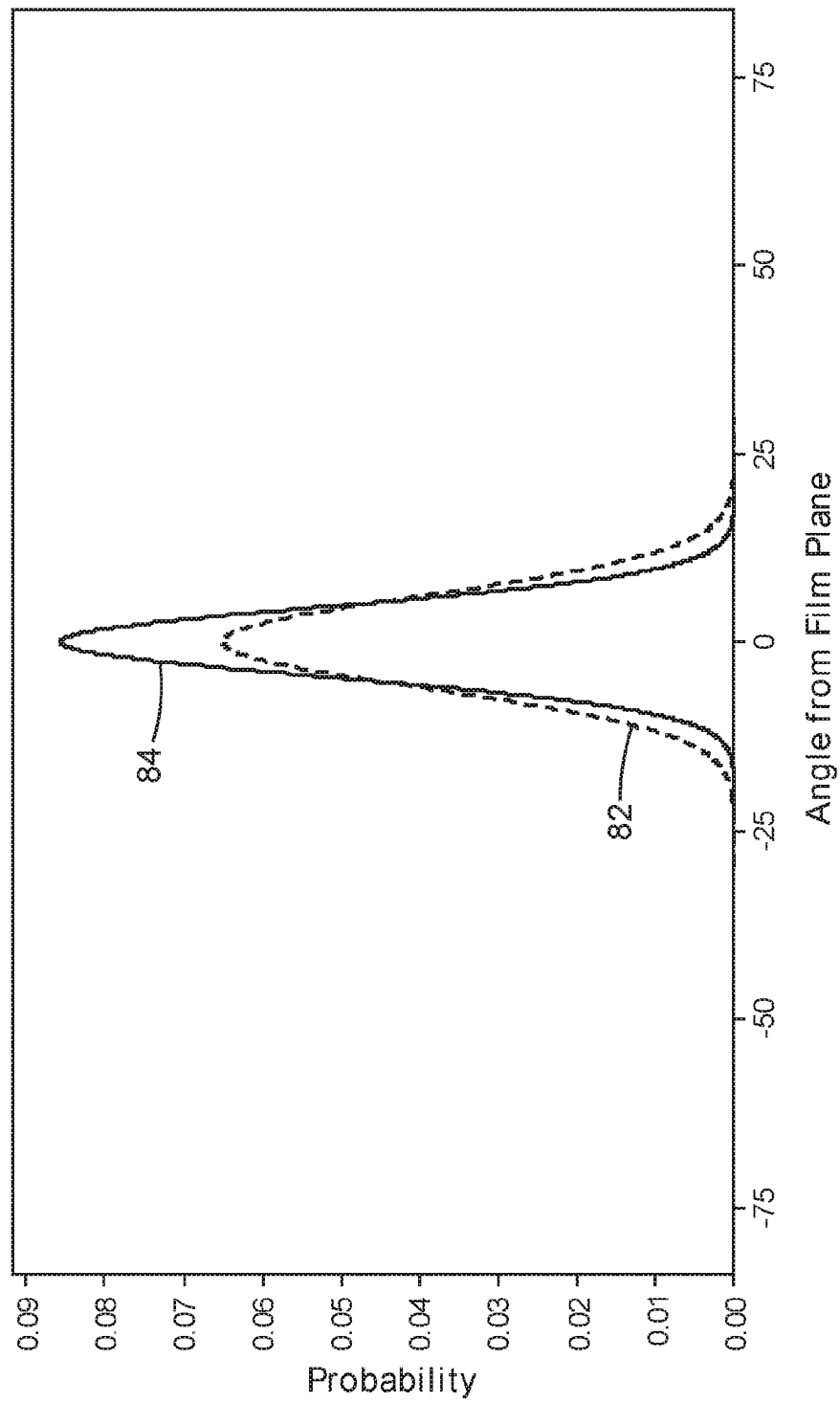

FIGS. 6A-6C compare films created using an embodiment of the magnetic film formation process using magnetic alignment and ultrasonic densification (film 80*b*) to a film created by substantially the same film formation process but without magnetic alignment (film 80*a*). FIG. 6A shows an image of the film 80*a* where magnetic alignment was not used, and FIG. 6B shows an image of the film 80*b* created using a process using magnetic alignment. Both films 80*a* and 80*b* underwent ultrasonic densification. The images shown that film 80*a* (non-magnetically-aligned) has a smaller degree of alignment and larger voids than film 80*b* (magnetically-aligned). FIG. 6C presents a comparison of orientation distribution functions for magnetically aligned, densified film 84 versus non-magnetically aligned, densified film 82. It can be seen from this example graph that films 84 made using magnetic alignment have a much tighter, higher distribution graph (i.e., a higher percentage of particles more closely aligned) than films 82 made without magnetic alignment.

Figure 7A:
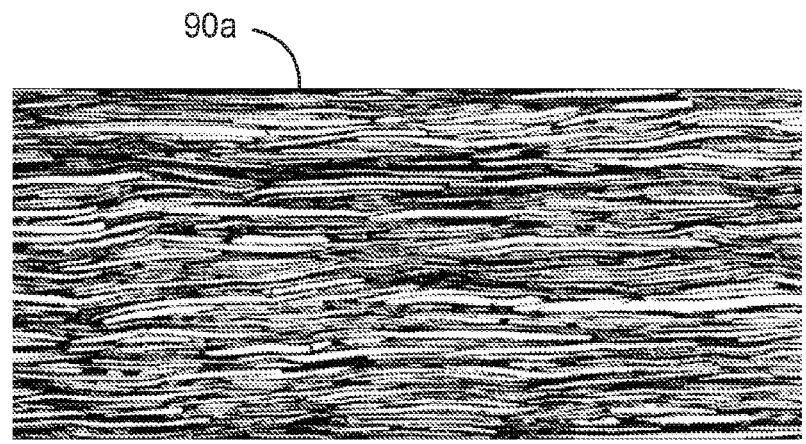
Figure 7B:
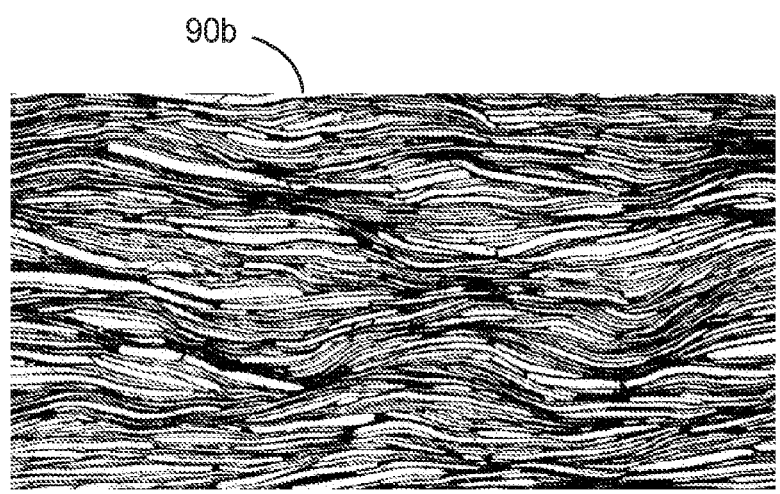

FIGS. 7A-7C compare films created using an embodiment of the magnetic film formation process using magnetic alignment and calendering (film 70*b*) to a film created by substantially the same film formation process but without magnetic alignment (film 70*a*). The processes used to create the images of FIGS. 7A and 7B are similar to those used to create the images of FIGS. 6A and 6B, except that a calendering process was used to densify both films instead of ultrasonic densification. FIG. 7A shows an image of the film 90*a* where magnetic alignment was not used, and FIG. 7B shows an image of the film 90*b* created using a process using magnetic alignment. Both films 90*a* and 90*b* underwent densification by calendering. The images shown that film 90*a* (non-magnetically-aligned) has a smaller degree of alignment and larger voids than film 90*b* (magnetically-aligned). FIG. 7C presents a comparison of orientation distribution functions for magnetically aligned, densified film 94 versus non-magnetically aligned, densified film 92. It can be seen from this example graph that films 94 made using magnetic alignment have a much tighter, higher distribution graph (i.e., a higher percentage of particles more closely aligned) than films 92 made without magnetic alignment.

Figure 8A:
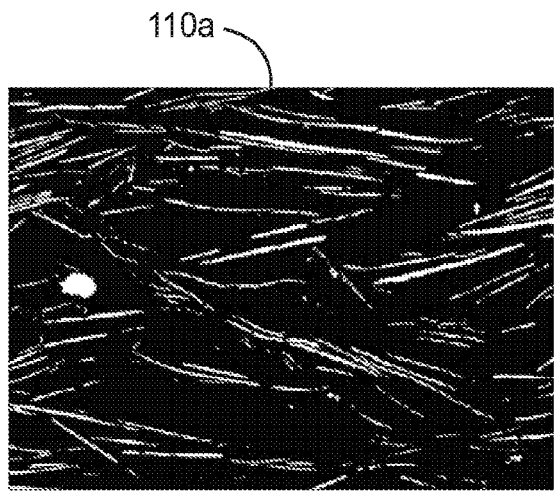
FIGS. 8A-8C provide information comparing a film created by a film formation process using magnetic alignment without densification in accordance with an embodiment of the present description compared to a typical prior art film.
Figure 8B:
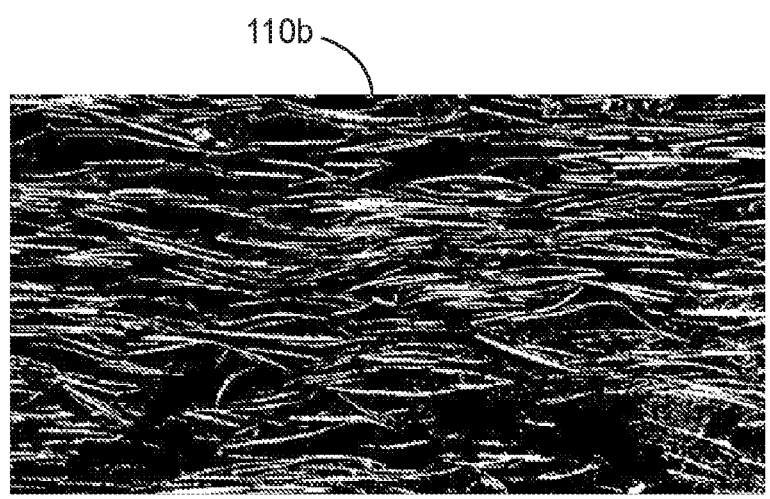
Figure 8C:
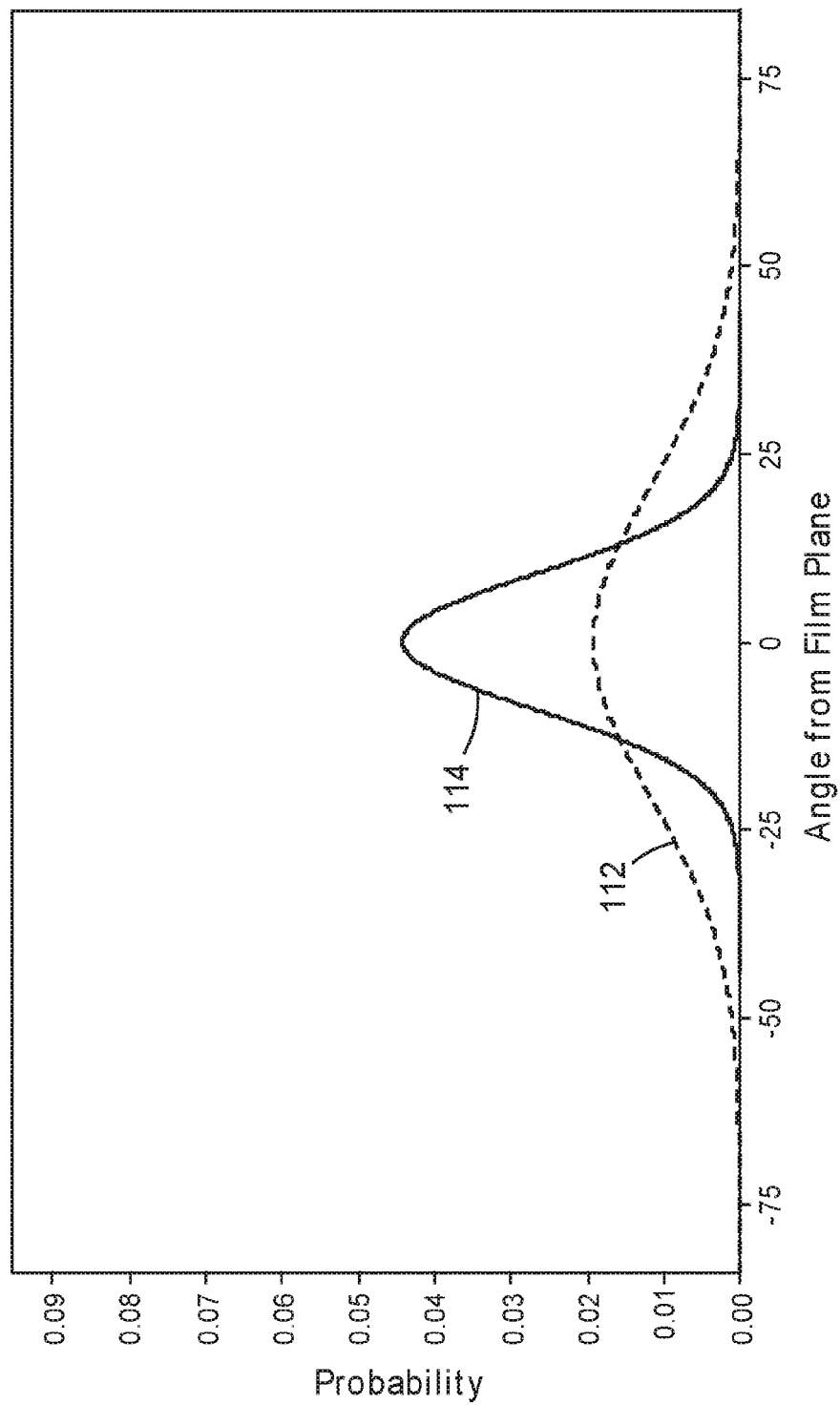

Finally, FIGS. 8A-8C compare films created using an embodiment of the magnetic film formation process using magnetic alignment and no densification step (film 110*b*) to a film created by substantially the same film formation process but without magnetic alignment (film 110*a*). FIG. 8A shows an image of the film 110*a* where magnetic alignment was not used, and FIG. 8B shows an image of the film 110*b* created using a process using magnetic alignment. Neither of films 110*a* nor 110*b* underwent densification. The images shown that film 110*a* (non-magnetically-aligned) has a smaller degree of alignment and larger voids than film 110*b* (magnetically-aligned). FIG. 8C presents a comparison of orientation distribution functions for magnetically aligned, non-densified film 114 versus non-magnetically aligned, non-densified film 112. It can be seen from this example graph that films 114 made using magnetic alignment have a tighter, higher distribution graph (i.e., a higher percentage of particles more closely aligned) than films 112 made without magnetic alignment.

Figure 9:
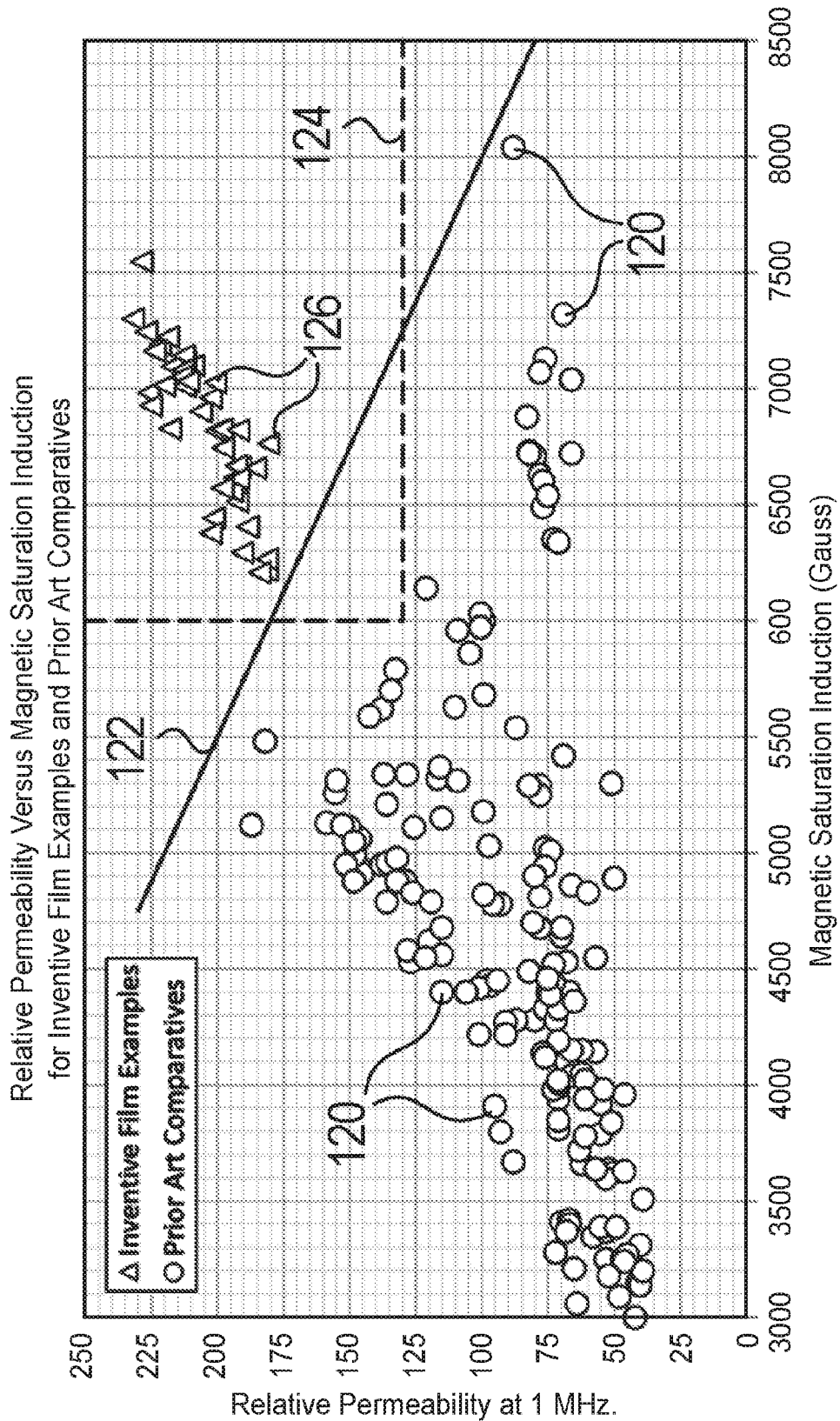
FIG. 9 is a graph plotting relative permeabilities versus magnetic saturation induction values for a magnetic shielding film in accordance with an embodiment of the present description.

FIG. 9 is a graph plotting relative permeabilities versus magnetic saturation induction values for a magnetic shielding film in accordance with an embodiment of the present description. In the graph, measured values for a number of prior art comparative shielding films 120 are plotted against measured values for magnetic shielding films 126 made using methods in accordance with one or more embodiments of the present description. Two boundary lines are provided on the graph to more clearly delineate the difference between prior art film results 120 and films 126 made using the methods described herein. The first boundary 122 is defined by the equation (420.0-0.04M), where M is a variable defining a magnetic saturation value of the magnetic shielding film in gauss. Boundary 122 clearly divides values for prior art films 120 from values for films 126 made by the present methods. That is, when measured at a frequency of about 1 MHz, a real part of a relative permeability of the magnetic shielding films 126 along an in-plane direction of the magnetic shielding film will be greater than (420.0-0.04M).

The second boundary 124 defines a region in the upper right corner of the graph wherein the relative permeability measured at about 1 MHz is greater than or equal to about 130, and the magnetic saturation induction value is greater than or equal to about 6000 gauss. The values measured for prior art films 120 appear only outside of the bounded region. The magnetic shielding films 126 made using methods in the present description exist only within the region bounded by boundary 124. That is, magnetic shielding films 126 are shown to exhibit magnetic saturations greater than about 6000 gauss, and have real parts of relative permeability $\mu'1$ and $\mu'2$ along respective thickness and in-plane directions of the film, µ'1 less than or equal to about 5 and µ'1 is greater than or equal to about 150 or about 140 or about 130.

Figure 10:
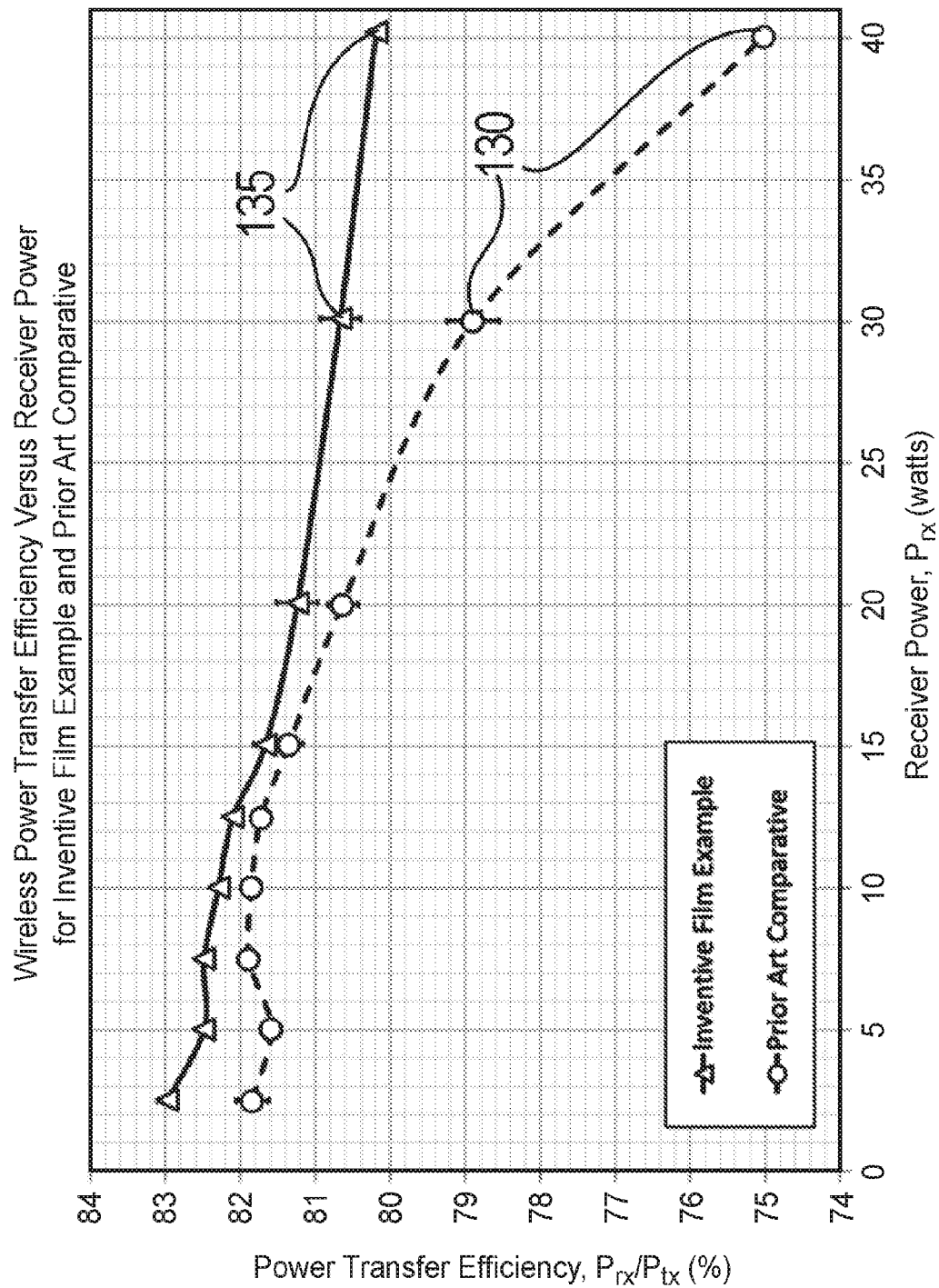
FIG. 10 is a graph plotting wireless power transfer efficiencies versus receiver power values for a magnetic shielding film in accordance with an embodiment of the present description.

FIG. 10 is a graph plotting wireless power transfer efficiencies versus receiver power values for a magnetic shielding film in accordance with an embodiment of the present description. Values are plotted for a number of prior art comparative films 130 against films 135 made using embodiments of methods of the present description. The Y-axis (along the left vertical edge of the graph) represent power transfer efficiency values measured for the films. The power transfer efficiency is based on the ratio Prx/Ptx, where Ptx represents the power transmitted by a transmitter antenna of a wireless charging system, and Prx represents the power received by a receiving antenna (i.e., the power actually transferred). The graph of FIG. 10 shows superior performance (higher power transfer efficiency values) at each level of receiver power Prx for the films 135 of the present description versus the prior art comparative films 130, especially at higher values of Prx. As is shown, after an increase in Prx results in an initial decrease of at least 1% in the power transfer efficiency (Prx/Ptx), the values of Prx/Ptx may decrease by less than about 5% in films 135 of the present description, when Prx is further increased so that Prx increases by at least a factor of two.

Figure 11:
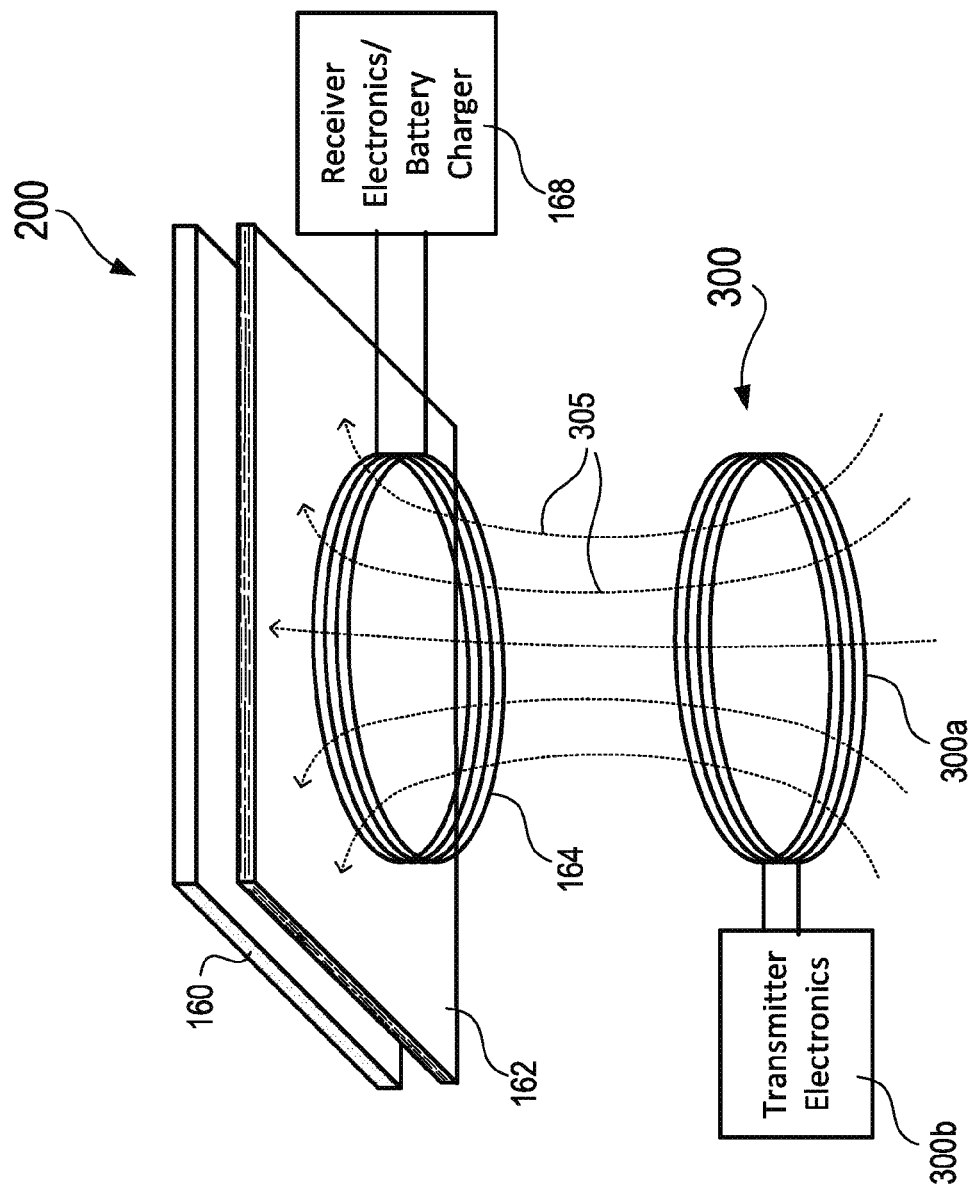
FIG. 11 is a perspective view of an electronic device using a magnetic shielding film, in accordance with an embodiment of the present description.

FIG. 11 is a perspective view of an electronic device using a magnetic shielding film, in accordance with an embodiment of the present description. An electronic device 200 (e.g., a smart phone with a wireless charging system) may include an electrically conductive plate 160 which may substantially attenuate an energy (e.g., absorb energy, or cancel the energy with a counter magnetic field) contained in electromagnetic waves 305 transmitted by a transmitting device 300, thereby reducing the amount of power received by a receiver antenna 164. For example, in some embodiments, the conductive plate 160 may represent metallic elements in electronic device 200, such as the metallic components of a battery. The electromagnetic waves 305 may cause eddy currents to be induced in the conductive plate 160, and those eddy currents may generate their own magnetic field in conductive plate 160 which may cancel and at least partially reduce the amount of power transferred from transmitting device 300.

In some embodiments, the electronic device 200 may include receiver electronics 168, which may, among other functions, condition the received energy (i.e., received power) for use in charging a battery. In some embodiments, the electronic device 200 may also include a magnetic shielding film 162, film 162 made in accordance with an embodiment of the present description (i.e., a shielding film which contains or includes anisotropically-shaped particles which are substantially aligned). In some embodiments, the transmitting device 300 (e.g., a wireless charging pad) may include a transmitter antenna 300a and transmitter electronics 300b. In some embodiments, the presence of magnetic shielding film 162 focuses electromagnetic waves 305 (i.e., magnetic field) toward the receiver antenna 164 and prevents the waves 305 from reaching the conductive plate 160 (preventing the induction of eddy currents in conductive plate 160), providing increased power transfer efficiency. As shown in FIG. 11, magnetic shielding films made in accordance with embodiments of the present description are shown to provide higher power transfer efficiencies, reducing charging times.

Figure 12:
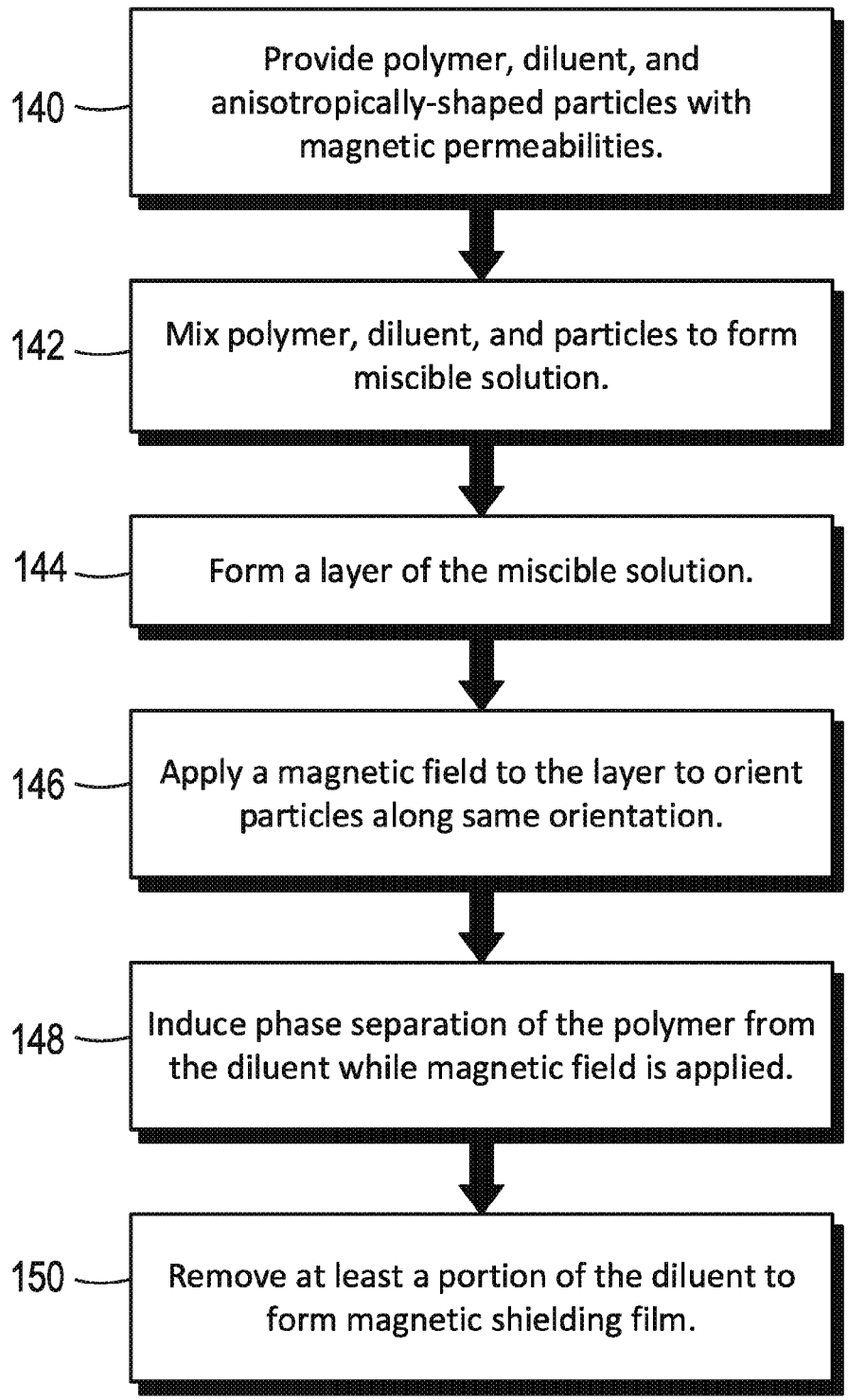
FIG. 12 is a flowchart of a method of making a magnetic shielding film, in accordance with an embodiment of the present description.

Finally, FIG. 12 is a flowchart of a method of making a magnetic shielding film, in accordance with an embodiment of the present description. At step 140, a polymer as described herein, a diluent (i.e., solvent) miscible with the polymer and, a plurality of anisotropically-shaped particles having magnetic permeabilities (e.g., the particles of FIGS. 3A-3D) are combined. At step 142, the polymer, diluent and particles are combined to form a miscible solution, and a layer is formed from the miscible solution at step 144 (e.g., the miscible solution is pushed through an extrusion die to create a film layer). At step 146, a magnetic field is applied to the layer in order to orient (i.e., align) the particles along substantially a same orientation direction (i.e., the magnetic moments of the particles cause the particles to orient such that the longest dimension aligns with the applied magnetic field.) At step 148, a phase separation of the polymer from the diluent is induced while the magnetic field is still applied to the layer, "locking" the particles in place while they are still aligned. At step 150, at least a portion of the diluent is extracted to form the final magnetic shielding film.

In some embodiments, an additional densification step (not shown) may be applied either after or simultaneously with the extraction of the diluent. This densification may be done through a number of means, including through calendering or by the introduction of ultrasonic energy to the film. Densification may be used as a means of further increasing the volume loading of the particles in the magnetic shielding film.

EXAMPLES

Generic Extrusion Process: A continuous roll of magnetic composite was prepared using the equipment illustrated in FIG. 2A. Extruder #1 was a 27 mm co-rotating twin screw (obtained under the trade designation "ZSK-25" from Werner Pfleiderer, Dusseldorf, Germany). Extruder #1 was operated at 200 rpm with the following temperature profile: Zone 1 93° C., Zone 2 104° C., Zones 3 through 6 193° C., Zones 7 and 8 210° C., Zone 9 221° C. Ultra-high molecular weight polyethylene (UHMW-PE) was fed into the feed funnel. Mineral oil was injected into heated Zone 2 and particles were side-stuffed into Zone 4. Melt was conveyed via heated tube to a 25 mm co-rotating twin screw, extruder #2 (obtained under the trade designation "ZE25x48D" from Berstorff, Munich, Germany). Extruder #2 was operated at 225 rpm with the following temperature profile: Zones 1 through 12 177° C. Mineral oil was injected into heated Zone 4. The gravimetric feed rates for the polymer, particles, and mineral oil are given in Table 1, and consistent with the target weight percent ratios given in FIG. 13. The melt composition was uniformly mixed and subsequently pumped through a 2" wide slot film die maintained at 177° C., and cast onto a heat stabilized 3 mil polyethylene terephthalate (PET) liner, which was then conveyed through the magnetic assembly of FIG. 2B before being quenched on a casting wheel maintained at a wheel temperature of 37° C., and a speed of 1.52 m/min.

TABLE 1

Formulation weight percent loadings and feed rates for example cases.

| | Formulation: | | | | | | |
|---|---|---|---|---|---|---|---|
| Example | Sendust Flakes Wt. % | UHMWPE Wt. % | Mineral Oil Wt. % | Feed Rates (lb/hr): | | | |
| Number | Solid Portion | Solid Portion | Total Mixture | Oil Extruder 1 | Oil Extruder 2 | Sendust | UHMWPE |
| 1 | 96.0 | 4.0 | 60.0 | 4.657 | 1.552 | 3.974 | 0.166 |
| 2 | 96.0 | 4.0 | 60.0 | 4.657 | 1.552 | 3.974 | 0.166 |
| 3 | 94.5 | 5.5 | 51.5 | 4.441 | 1.480 | 5.270 | 0.307 |
| 4 | 95.0 | 5.0 | 43.0 | 4.227 | 1.409 | 7.098 | 0.374 |

After initial sample films proved an increase in magnetic permeability from magnetic alignment of the particles within the films, a new set of designed experiments was performed to determine the empirical relationships between permeability and a number of factors. These factors included percent solvent loading, weight percent of the particles within the film, and the positioning of the film within the applied planar magnetic field (based on the position of at least the bottom skid plate upon which the film rests as it moves between the magnets). In the experiments, the solvent used was mineral oil, the particles in the film were Sendust SP-85 powder (in flake form), and the polymer resin was ultra-high molecular weight polyethylene (UHMW-PE) GUR® 2126. Table 2 shows the key material properties referenced herein and the measurement methods used.

TABLE 2

Material Properties, Measurement Methods, and Measurement Equipment.

| Parameter | Measurement Method | Instrument |
|---|---|---|
| Real and Imaginary Permeability Spectra | Impedance Analyzer and Terminal Adaptor | Agilent Technologies, E4990A. Keysight Terminal Adaptor, 42942A. |
| Magnetic Saturation Induction, Coercivity | Vibrating Sample Magnetometer | Lake Shore Cryotronics, Inc. Head Drive: 7400 Series, Electromagnet: EM7-HV, Power Supply: Model 648. |
| Power Transfer Efficiency | Measure power transfer between impedance matched transmitter and receiver coils shielded by magnetic films. | Custom system (developed in-house) |

For the set of experiments performed, the total feed rate volumes were kept fixed for each design point. The objective was to produce films of similar thickness having similar die exit velocity (actual line speed ranged from 4.7 to 5.5 feet per minute) to minimize convoluting effects from formulation from effects related to die shear. The results of the experiments are summarized in FIGS. 13 through 16.

Design of Experiments (DOE) Variables

1. Oil loading
2. Particles (Sendust) to polymer ratio
3. Lower (bottom) magnetic skid plate position For the experiments, four sample films were made and measured. FIG. 13 is a table summarizing the values used for each of the DOE variables and the measured performance of the four magnetic shielding film examples. The examples provided additional process detail and demonstrated how formulation influences the ability of the material to respond to the magnetic field. Formulations that facilitate flake (particle) orientation show higher permeability in the plane through increased particle alignment in that direction. Except where otherwise noted, these examples had the same process conditions at the extrusion and ultrasonic densification steps.

The most significant formulation differences between the four examples are the following:

Examples 1, 2, and 4 were magnetically aligned. Example 3 had no magnetic alignment.

Examples 1 and 2 have the highest oil content, and higher permeabilities. The main difference between Examples 1 and 2 is the skid plate setting. The film in Example 1 ran closer to the geometric center of the magnets (i.e., closer to the center of the planar magnetic field). It has slightly higher permeability than Example 2.

Example 3 has a medium oil content, and no magnetic alignment. It shows a lower permeability value, but not as low as Example 4.

Example 4 has the lowest oil content, and lowest permeability, even though it was magnetically aligned. It appears that the lower permeability in Example 4 is caused by the influence of other factors affecting flake alignment, such as steric interactions in shear flow, which could also have a concentration dependence.

Figure 14:
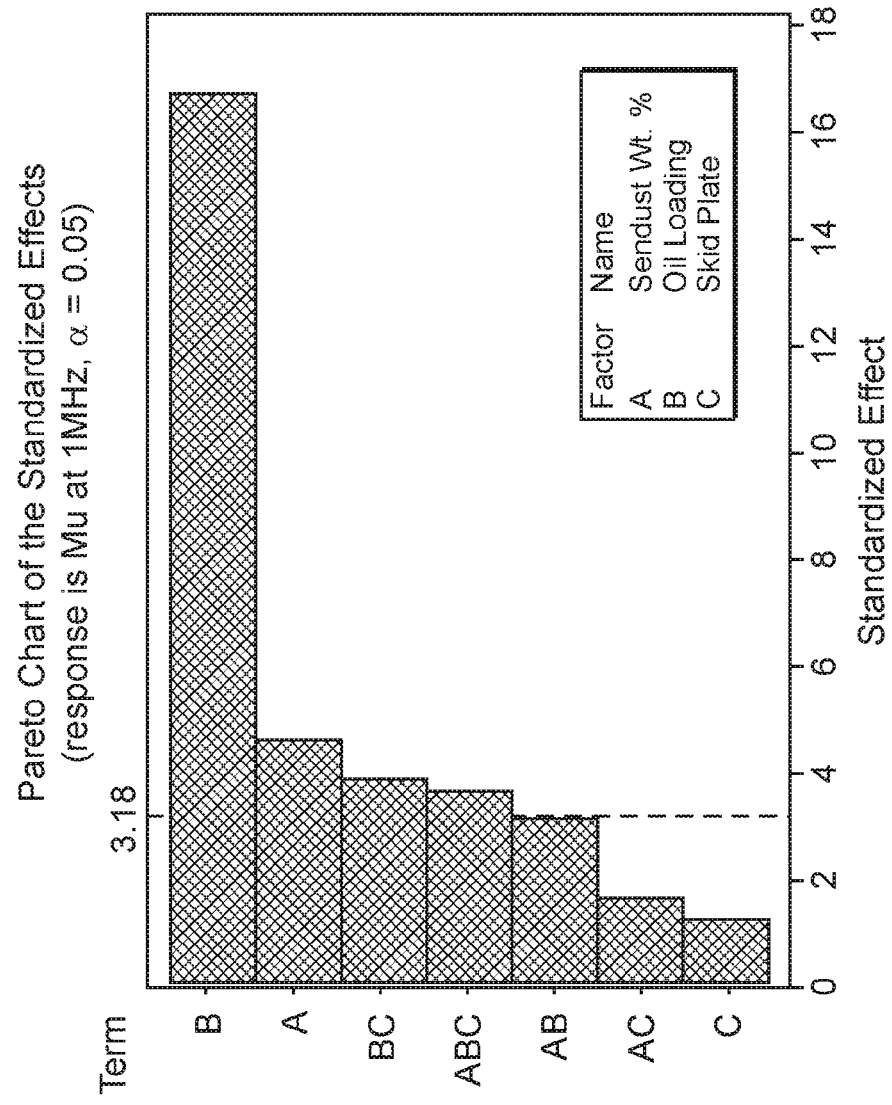
FIG. 14 is a pareto chart showing the effects of various design parameters on the magnetic permeability of example magnetic shielding films, in accordance with an embodiment of the present description.
Figure 15:
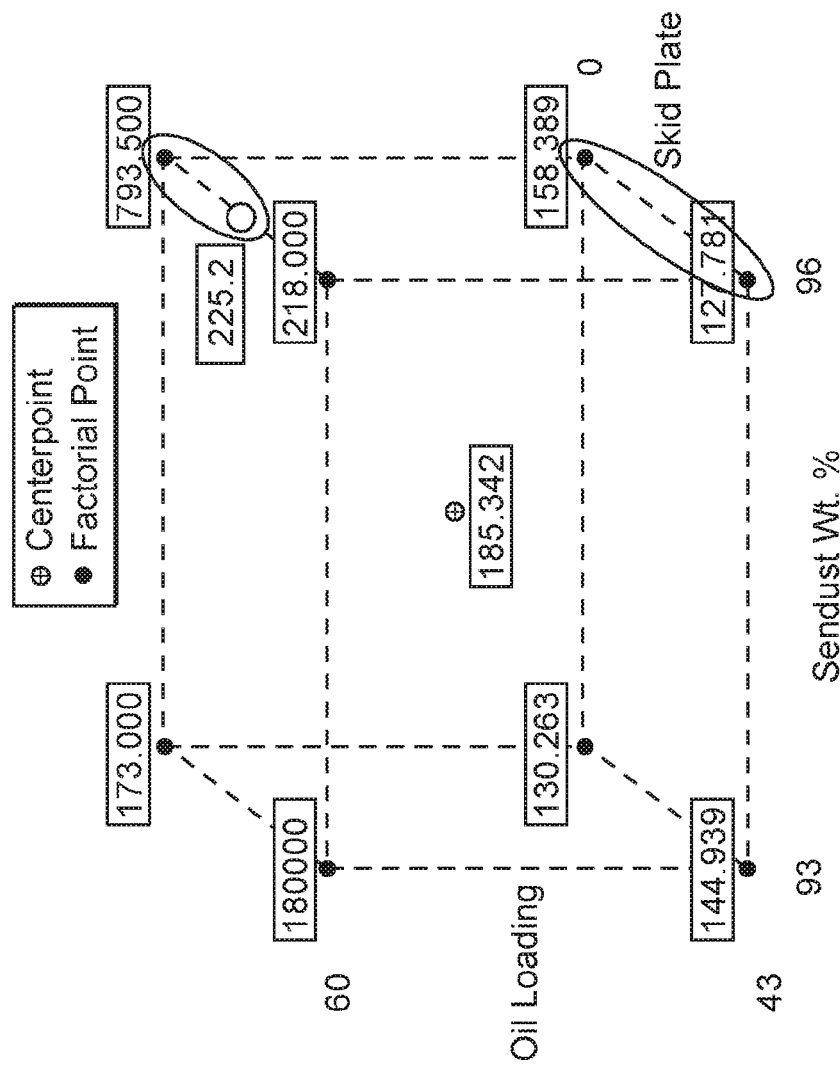
FIG. 15 is a cube plot showing the effects of various design parameters on the magnetic permeability of example magnetic shielding films, in accordance with an embodiment of the present description.
Figure 16:
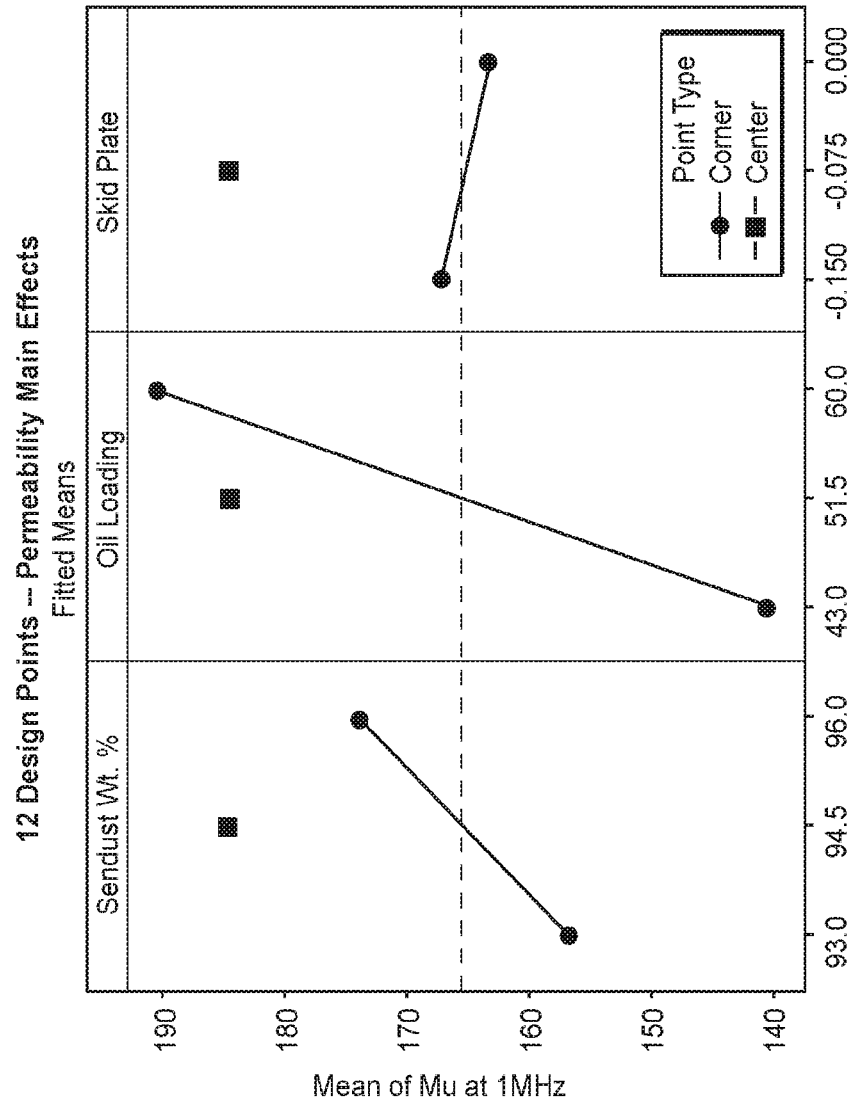
FIG. 16 is a plot showing the effects of various design parameters on the magnetic permeability of example magnetic shielding films, in accordance with an embodiment of the present description.

FIGS. 14-16 provide a summary of the results of the four experiments. FIG. 14 is a pareto chart showing the effects of various design parameters on the magnetic permeability of example magnetic shielding films. The response shown by the horizontal bars is the magnetic permeability as measured at 1 MHz. Within the practical range of interest for the three variables (A—Sendust Wt. %, B—Oil Loading Percent, and C—Skid Plate Position), oil loading was by far the most significant factor. Higher oil loadings were associated with higher permeability, which would correlate with better flake alignment.

FIG. 15 is a cube plot showing the effects of various design parameters on the magnetic permeability (Mu) as measured at 1 MHz for the example magnetic shielding films. The width of the cube (left to right) represents a variation in Sendust Wt. % from 93% to 96%. The height of the cube (top to bottom) represents a variation in mineral oil percentage from 43% loading to 60% loading. The depth of the cube (from front plane to back plane of the cube) represents position of the bottom skid plate (corresponding to the approximate position of the film passing between the magnets) from −0.15 to 0 inches, where 0 inches corresponds to the geometric center between the two magnets. The cube plot helps identify which combinations of the three factors lead to the highest permeability values. Measured permeability values are shown as numbers in rectangular boxes located near the vertices of the cube, the center point, and one additional point on the upper right edge of the cube (labeled with a permeability value of 225.2).

FIG. 16 is a plot of the fitted means of 12 design points (full factorial design, $2^3$ points+4 center points) showing the effects of various design parameters on the magnetic permeability of the example magnetic shielding films. It can be seen from FIG. 16 that oil loading has the single largest effect on the measured magnetic permeability, while the position of the skid plate has the smallest effect.

Measurement of the Example Films

The following section describes how the measurements of permeability, magnetic moment, and power efficiency, as described in the specification and claims, were completed.

I. Static Magnetic Properties

Samples were die cut into 6 mm disks prior to the magnetic measurements. Lakeshore vibrating sample magnetometer (VSM) 7400-S was used to record magnetic hysteresis loops (M-H curves). The magnetizing field H was applied in the plane of the samples. The magnetic field span was set to H=±4 kOe and saturation magnetization $4\pi M_s$ was measured at full saturation (|H|=4 kOe). Magnetizing field H was measured with step of 0.14 Oe and coercivity filed $H_c$ was defined in vicinity of $4\pi M$=0 via linear fitting based on 6 points.

II. Dynamic Magnetic Properties

Samples were die cut into toroids with outer diameter of 18 mm and inner diameter of 6 mm. The Keysight magnetic test fixture 16454A and impedance meter E4990A were used to measure real part of relative magnetic permeability $\mu_r$. The data were analyzed in accordance with Keysight manual for 16454A.

III. Wireless Power Transfer Test a. Test Circuit

Wireless power transfer performance is tested using a circuit as described here. A signal generator was used to provide a clean sinusoidal signal at 128 kHz. This signal was amplified by an RF amplifier and delivered to a TX matching circuit. Matching circuit voltage and current probes are used to measure power accepted by the TX (transmitting) coil, Ptx. Most of this power is then transferred to the load via RX (receiving) coil and RX matching circuit. The power received by the load Prx is measured using another set of voltage and current probes.

b. Electrical Specification of Components

Self-resonance of free-standing TX and RX coils must be at least 20 times of the test frequency of 128 kHz.
AC resistance of the free-standing TX coil should be ≤0.1Ω and inductance should be approximately 6 μH.
AC resistance of the free-standing RX coil without magnetic shielding materials should be ≤0.3Ω.
AC resistance of the wirings for TX and RX should not exceed 20 mΩ.
TX wiring inductance should be ≤3%, and RX wiring inductance should be ≤2% of inductance measured for free standing coils. Free standing coil is a coil with a sheet of magnetic material only on one side of the coil and distanced from any metallic or magnetic elements by at least 3 times of the outer diameter of the coil.
Load must be chosen or modified so that real part of impedance of the load is 7.48Ω±0.05Ω and imaginary part of impedance is ≤±0.01Ω.
Signal generator, amplifier, oscilloscope(s), and current and voltage probes must be within manufacture specified ratings for the test frequencies, current and voltage amplitudes, or must be certified by independent party.

c. Tuning RX Matching Circuit

Capacitance of the RX matching circuit should be tuned prior to testing. System must be preassembled. The TX coil should be disconnected from matching circuit and impedance analyzer is connected to the RX side instead of the load. An impedance analyzer must be calibrated according to the manufacturer manual and at the point of connection to the RX side of the circuit. The RX capacitor must be chosen to result in series LCR resonance condition (minimum of the total measured impedance |Z|) at the test frequency of 128 kHz. While it is hard to tune exactly to the test frequency, the major guidance should be that phase measured by impedance analyzer is within ±5 degrees from zero.
Difference in the power efficiency due to different capacitors used for testing of different magnetic shielding films should not exceed 0.5%.

d. Test Signal

Frequency of the test signal should be set with prediction of 100 Hz (i.e. 128 kHz±100 Hz).
To minimize uncontrolled heating the test signal could be pulse modulated with the pulse width of 94 μs (power ON stage) and pulse period 10 ms (power OFF stage). In this case, all TX and RX power measurements should be performed within approximately 16 μs measurement window when power is in ON stage. Measurement window must be at least 16 μs from the rising and falling edges of the power pulse.
If measurements are performed with continuous wave signal, then system components must be cooled to insure temperatures≤30° C. on TX coil elements. High temperatures may result in serious performance degradation of TX coil, since it is usually utilizing ferrite material. Also, capacitors in RX tuning circuit must be chosen so that temperature has minimum effect on their performance (i.e. result in ≤0.5% changes in measured power efficiency).

e. System Linearity

System performance, excluding RX coil with material under test, must have minimum effect on the signal purity within tested RX power range. The highest harmonic in the test signal measured by RX and TX probes should be at least 10 times smaller than amplitude (current or voltage) of the main 128 kHz signal. This could be tested by choosing proper RX and TX coil material which has linear response within tested RX power range.

f. Power Measurement

Measured powers are defined as $P=1/2*Im*Vm*\cos(\phi_{IV})$, where Im and Vm are current and voltage amplitudes, and $\phi_{IV}$ is the phase difference between current and voltage signals.

The total current and voltage measurement accuracy of the system must be <=1%, and phase<=1 deg. The averaging should be used to achieve power resolution<=0.3%.

g. Structure of RX and TX Coils

RX and TX coils must be flat coils made of insulated wire. With no more than 200 μm thick insulation for TX and no more than 50 μam thick insulation for RX coils.
RX and TX coils must be circular shape.
TX coil inner and outer diameters (OD) should be within 30% of those for RX coil.
TX coil should have magnetic shielding material attached to it. This material should provide reduction of magnetic field behind it by a factor of ≥10. Magnetic shielding material must be a flat sheet with lateral dimensions~20% of TX coil OD.
TX and RX coils must comprise N number of turns, where 3≤N≤10.
RX coil magnetic shielding sheet must have lateral dimensions~20% of RX coil OD. Magnetic material sheet should reside directly on the RX windings. Aluminum plate of thickness t≥0.5 mm must be attached to the magnetic shielding sheet via≤10 μm thick adhesive. Lateral dimensions of the aluminum plate must be like those for magnetic shielding sheet. The final assembly is schematically shown below.
RX and TX coil axis must be aligned laterally so that measured power efficiency doesn't change within ≤0.3%.
RX and TX coils must be separated along coils axis by 1.6 mm.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

Terms such as "substantially" will be understood in the context in which they are used and described in the present description by one of ordinary skill in the art. If the use of "substantially equal" is not otherwise clear to one of ordinary skill in the art in the context in which it is used and described in the present description, "substantially equal" will mean about equal where about is as described above. If the use of "substantially parallel" is not otherwise clear to one of ordinary skill in the art in the context in which it is used and described in the present description, "substantially parallel" will mean within 30 degrees of parallel. Directions or surfaces described as substantially parallel to one another may, in some embodiments, be within 20 degrees, or within 10 degrees of parallel, or may be parallel or nominally parallel. If the use of "substantially aligned" is not otherwise clear to one of ordinary skill in the art in the context in which it is used and described in the present description, "substantially aligned" will mean aligned to within 20% of a width of the objects being aligned. Objects described as substantially aligned may, in some embodiments, be aligned to within 10% or to within 5% of a width of the objects being aligned.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A magnetic shielding film comprising opposing first and second major surfaces and a plurality of particles dispersed therebetween, each particle having a magnetic permeability, a thickness H along a thickness direction of the particle, and a longest dimension L along a length direction of the particle orthogonal to the thickness direction, L/H greater than or equal to 2, the particles defining a plurality of voids therebetween, the length directions of at least 60% of the particles oriented within 5.5 degrees of a same orientation direction,
such that in a cross-section of the magnetic shielding film in a vertical direction substantially orthogonal to at least one of the first and second major surfaces, the magnetic shielding film comprises a plurality of pairs of vertically adjacent particles, wherein a plurality of substantially parallel elongate polymeric elements connects the particles in each of the pairs of vertically adjacent particles.

2. The magnetic shielding film of claim 1, wherein at least some of the voids in the plurality of voids are interconnected.

3. The magnetic shielding film of claim 1, wherein the substantially parallel elongate polymeric elements that connect the particles in each of the pairs of vertically adjacent particles, are substantially oriented along the vertical direction.

4. The magnetic shielding film of claim 1, wherein the elongate polymeric elements comprise polyethylene.

5. The magnetic shielding film of claim 1, wherein the orientation direction is substantially parallel to the first and second major surfaces.

6. The magnetic shielding film of claim 1, wherein the particles are rod-shaped or disc-shaped.

7. The magnetic shielding film of claim 1, wherein the particles comprise one or more of iron, silicon, aluminum, chromium, nickel, copper, cobalt, and molybdenum.

8. The magnetic shielding film of claim 1, wherein the particles comprise magnetic coatings on outermost surfaces thereof.

9. The magnetic shielding film of claim 8, wherein the uncoated particles do not have magnetic permeability.

10. The magnetic shielding film of claim 1 having real parts of relative permeability μ'1 and μ'2 along respective thickness and in-plane directions of the film, μ'2/μ'1≥100 at a frequency of about 1 MHz.

11. The magnetic shielding film of claim 10, wherein μ'1≤5 at about 1 MHz.

12. The magnetic shielding film of claim 10 having an average thermal conductivity of at least 0.15 W/(m·K) along a thickness direction of the magnetic shielding film.

13. The magnetic shielding film of claim 10 having an average thermal conductivity of at least 5 W/(m·K) along an in-plane direction of the magnetic shielding film.

14. The magnetic shielding film of claim 1, wherein the particles have an average thickness in a range from about 0.5 microns to about 5 microns, and an average longest dimension in a range from about 20 microns to about 200 microns.

15. The magnetic shielding film of claim 1, wherein the particles are thermally conductive.

16. The magnetic shielding film of claim 1, wherein the particles comprise thermally conductive coatings on outermost surfaces thereof.

17. The magnetic shielding film of claim 1 further comprising a resin disposed between the first and second major surfaces, the plurality of particles dispersed in the resin, the resin having a number average molecular weight greater than about $10^4$ g/mol.

18. The magnetic shielding film of claim 17, wherein the number average molecular weight of the resin is less than about $10^7$ g/mol.

19. The magnetic shielding film of claim 1, wherein the particles in the plurality of particles are dispersed between the first and second major surfaces at a volume loading of greater than about 50 percent.

* * * * *